US012584976B2

(12) United States Patent (10) Patent No.: US 12,584,976 B2
Lassalle-Balier et al. (45) Date of Patent: Mar. 24, 2026

(54) FLUX CONCENTRATOR AND MAGNETORESISTANCE CONFIGURATIONS

(71) Applicant: Allegro MicroSystems, LLC, Manchester, NH (US)

(72) Inventors: Rémy Lassalle-Balier, Bures sur Yvette (FR); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 18/419,683

(22) Filed: Jan. 23, 2024

(65) Prior Publication Data

US 2025/0237714 A1 Jul. 24, 2025

(51) Int. Cl.
*G01R 33/09* (2006.01)
*G01R 33/00* (2006.01)
*G01R 33/07* (2006.01)

(52) U.S. Cl.
CPC ...... *G01R 33/0011* (2013.01); *G01R 33/0005* (2013.01); *G01R 33/07* (2013.01); *G01R 33/098* (2013.01)

(58) Field of Classification Search
CPC ............ G01R 33/0005; G01R 33/0011; G01R 33/07; G01R 33/098
See application file for complete search history.

(56) References Cited

U.S. PATENT DOCUMENTS

| | | | |
|---|---|---|---|
| 5,247,202 | A | 9/1993 | Popovic et al. |
| 6,184,679 | B1 | 2/2001 | Popovic et al. |
| 7,476,953 | B2 | 1/2009 | Taylor et al. |
| 7,777,607 | B2 | 8/2010 | Taylor et al. |
| 9,797,746 | B2 | 10/2017 | Vuillermet et al. |
| 10,782,152 | B2 | 9/2020 | Vuillermet et al. |
| 11,624,799 | B2 | 4/2023 | Cesaretti et al. |
| 11,719,527 | B2 | 8/2023 | Lassalle-Balier |
| 11,733,024 | B2 | 8/2023 | Cesaretti et al. |
| 2022/0075008 | A1 | 3/2022 | Romero |
| 2023/0332878 | A1 | 10/2023 | Lassalle-Balier et al. |
| 2023/0400537 | A1 | 12/2023 | Lassalle-Balier et al. |
| 2025/0112170 | A1* | 4/2025 | Thompson .............. H01F 17/04 |

OTHER PUBLICATIONS

U.S. Appl. No. 18/333,680, filed Jun. 13, 2023, Jaiswal.
Multi Dimension Datasheet "TMR2501 Z-axis TMR linear sensor",V1. 2, date unknown, 5 pages.

* cited by examiner

*Primary Examiner* — Alesa Allgood
(74) *Attorney, Agent, or Firm* — DALY, CROWLEY, MOFFORD & DURKEE, LLP

(57) ABSTRACT

A magnetic field sensor includes magnetoresistance elements supported by a surface of the die defining a plane, and a concentrator layer over the surface of the die and having an aperture. A first magnetoresistance element is adjacent to a first edge of the aperture and has a first reference direction parallel to the surface of the die and substantially perpendicular to the first aperture edge and a second magnetoresistance element is adjacent to a second edge of the aperture and has the first reference direction. The concentrator layer redirects the applied magnetic field to present a differential field parallel to the plane of the die to the magnetoresistance elements in response to applied field perpendicular to the plane of the die and to present a reduced magnitude and common mode field to the magnetoresistance elements in response to the applied field parallel to the plane of the die.

13 Claims, 16 Drawing Sheets

Detail A-A

FLUX CONCENTRATOR AND MAGNETORESISTANCE CONFIGURATIONS

BACKGROUND

Magnetic field sensors employ a variety of types of magnetic field sensing elements, for example, Hall effect elements and magnetoresistance elements, often coupled to electronics on a common substrate. Some magnetic field sensors include magnetoresistance (MR) elements, such as giant magnetoresistance (GMR) elements and tunneling magnetoresistance (TMR) elements. Generally, GMR and TMR elements have a relatively high sensitivity compared, for example, to Hall effect elements.

As is known, some types of magnetic field sensing elements tend to have an axis of maximum sensitivity parallel to a substrate or in the plane of the substrate that supports the magnetic field sensing element, and other types of magnetic field sensing elements tend to have an axis of maximum sensitivity perpendicular to a substrate that supports the magnetic field sensing element. In particular, planar Hall effect elements tend to have axes of maximum sensitivity perpendicular to a substrate, while magnetoresistance elements (e.g., GMR, TMR, AMR) and vertical Hall effect elements tend to have axes of maximum sensitivity parallel to a substrate.

Magnetic field sensors are used in a variety of applications, including, but not limited to an angle sensor that senses an angle of a direction of a magnetic field, a current sensor that senses a magnetic field generated by a current flow through a conductor, a magnetic switch that senses the proximity of a ferromagnetic object, a motion detector that senses rotation and/or linear motion, for example motion of passing ferromagnetic articles in the form of magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

SUMMARY

The present disclosure provides a magnetic field sensor including a flux concentrator design and a layout of magnetoresistance elements configured to sense out-of-plane magnetic field with high sensitivity while being substantially insensitive to in-plane fields.

According to the disclosure, a magnetic field sensor to sense an applied magnetic field includes a semiconductor die having a surface that defines a plane of the semiconductor die, a first magnetoresistance element supported by the surface of the semiconductor die, a second magnetoresistance element supported by the surface of the semiconductor, and a concentrator layer. The concentrator layer is disposed over the surface of the semiconductor die and has an aperture with a first edge and a second edge substantially parallel to the first edge, wherein the first magnetoresistance element is positioned adjacent to the first edge of the aperture and has a first reference direction parallel to the surface of the semiconductor die and substantially perpendicular to the first edge of the aperture and wherein the second magnetoresistance element is positioned adjacent to the second edge of the aperture and has the first reference direction.

Features may include one or more of the following individually or in combination with other features. The concentrator layer is configured to redirect the applied magnetic field to present a differential magnetic field parallel to the plane of the semiconductor die to the first and second magnetoresistance elements in response to the applied magnetic field perpendicular to the plane of the semiconductor die, and to present a reduced magnitude and common mode magnetic field to the first and second magnetoresistance elements in response to the applied magnetic field parallel to the plane of the semiconductor die. An output signal of the magnetic field sensor generated by subtraction of signals from the first magnetoresistance element and the second magnetoresistance element is sensitive to the applied magnetic field perpendicular to the plane of the semiconductor die and insensitive to the applied magnetic field parallel to the plane of the semiconductor die.

The concentrator layer can be disposed on the surface of the semiconductor die. An insulator can be disposed on the surface of the semiconductor die, wherein the concentrator layer is disposed on the insulator.

The concentrator layer can have a plurality of apertures arranged in a grid including a plurality of rows and a plurality of columns, wherein each of the plurality of apertures has a respective first edge and a respective second edge substantially parallel to the respective first edge, wherein the magnetic field sensor further includes a plurality of additional first magnetoresistance elements and a plurality of additional second magnetoresistance elements, wherein each of the plurality of apertures further has a respective first magnetoresistance element positioned adjacent to the respective first edge and a respective second magnetoresistance element positioned adjacent to the respective second edge. The grid can form a square, an ellipse, a circle, or a rectangle. A spacing between adjacent rows of the grid can be the same as a spacing between adjacent columns of the grid. A spacing between adjacent rows of the grid can be different than a spacing between adjacent columns of the grid. A spacing between each of the plurality of rows of the grid can be the same. A spacing between at least two adjacent rows of the plurality of rows of the grid can be different than a spacing between at least two other adjacent rows of the plurality of rows of the grid. The concentrator layer has an outer edge and a distance between a closest one of the plurality of apertures to the outer edge of the concentrator layer can be larger than a spacing between adjacent apertures of the plurality of apertures.

In embodiments, the aperture can have a shape selected from a square, an ellipse, a circle, or a rectangle. The aperture can have rounded corners. The first edge of the aperture and the second edge of the aperture define a periphery of the aperture. The first magnetoresistance element and the second magnetoresistance element can be positioned partially inside the periphery of the aperture and partially outside the periphery of the aperture. The first magnetoresistance element and the second magnetoresistance element can be positioned entirely inside the periphery of aperture. The first magnetoresistance element and the second magnetoresistance element can be positioned entirely outside of the periphery of aperture.

The aperture in the concentrator layer has a third edge substantially perpendicular to the first edge and the second edge and further has a fourth edge substantially parallel to the third edge and the sensor can further include a third magnetoresistance element supported by the surface of the semiconductor die adjacent to the third edge of the aperture and having a second reference direction substantially perpendicular to the third edge of the aperture and to the first reference direction and a fourth magnetoresistance element supported by the surface of the semiconductor die adjacent to the fourth edge of the aperture and having the second reference direction. In embodiments, the first magnetoresistance element and the second magnetoresistance element are coupled in series between a power connection and a ground connection to form a half bridge. In embodiments, the first magnetoresistance element is coupled in series with a first current source between a power connection and a ground connection and wherein the second magnetoresistance element is coupled in series with a second current source between a power connection and a ground connection to form a bridge.

The magnetic field sensor can further include a third magnetoresistance element supported by the surface of the semiconductor die adjacent to the first edge of the aperture and having the first reference direction and a fourth magnetoresistance element supported by the surface of the semiconductor die adjacent to the second edge of the aperture and having the first reference direction. The first magnetoresistance element and the second magnetoresistance element can be coupled in series to form a first series string and the third magnetoresistance element and the fourth magnetoresistance element can be coupled in series to form a second series string. The first series string and the second series string can be coupled in parallel with the first magnetoresistance element and the fourth magnetoresistance element coupled to a power connection and with the second magnetoresistance element and the third magnetoresistance element coupled to ground to form a bridge.

The aperture can be a first aperture and the concentrator layer can further have a second aperture with a first edge and a second edge substantially parallel to the first edge. The sensor can further include a third magnetoresistance element supported by the surface of the semiconductor die adjacent to the first edge of the second aperture and having the first reference direction and a fourth magnetoresistance element supported by the surface of the semiconductor die adjacent to the second edge of the second aperture and having the first reference direction. The first magnetoresistance element and the second magnetoresistance element can be coupled in series to form a first series string and the third magnetoresistance element and the fourth magnetoresistance element are coupled in series to form a second series string. The first series string and the second series string can be coupled in parallel with the first magnetoresistance element and the fourth magnetoresistance element coupled to a power connection and with the second magnetoresistance element and the third magnetoresistance element coupled to ground to form a bridge.

The first magnetoresistance element and the second magnetoresistance element can be TMR elements.

The magnetic field sensor can further include first processing circuitry coupled to the first magnetoresistance element and the second magnetoresistance element and configured to generate an MR output signal indicative of the applied magnetic field perpendicular to the plane of the semiconductor die, a Hall effect element, and second processing circuitry coupled to the Hall effect element and configured to generate a Hall output signal indicative of the applied magnetic field perpendicular to the plane of the semiconductor die. In embodiments, the Hall effect element and the first and second magnetoresistance elements are configured to sense a magnetic field generated by a current through a conductor. The Hall effect element can be configured to sense the current in a first current range and the first and second magnetoresistance elements can be configured to sense the current in a second current range that is different than the first current range.

The first magnetoresistance element and the second magnetoresistance element can be coupled in series to form a first bridge and wherein the concentrator layer is disposed on a first portion of the surface of the semiconductor die and is not disposed on a second portion of the surface of the semiconductor die. The sensor can further include a third magnetoresistance element supported by the second portion of the surface of the semiconductor die and having the first reference direction, a fourth magnetoresistance element supported by the second portion of the surface of the semiconductor die and having a second reference direction that is opposite with respect to the first reference direction, wherein the third magnetoresistance element and the fourth magnetoresistance element are to form a second bridge, first processing circuitry coupled to the first bridge and configured to generate a first MR output signal indicative of the applied magnetic field perpendicular to the plane of the semiconductor die in a z-direction, and second processing circuitry coupled to the second bridge and configured to generate a second MR output signal indicative of the applied magnetic field parallel to the plane of the semiconductor die in a first one of an x-direction or a y-direction. The sensor can further include a fifth magnetoresistance element supported by the second portion of the surface of the semiconductor die and having a third reference direction perpendicular to the first reference direction, a sixth magnetoresistance element supported by the second portion of the surface of the semiconductor die and having a fourth reference direction that is opposite with respect to the third reference direction, wherein the fifth magnetoresistance element and the sixth magnetoresistance element are coupled in series to form a third bridge, and third processing circuitry coupled to the third bridge and configured to generate a third MR output signal indicative of the applied magnetic field parallel to the plane of the plane of the semiconductor die in a second one of the x-direction or the y-direction. In embodiments, the first, second, third, fourth, fifth, and sixth magnetoresistance elements are formed from a single stack.

One or both of the first magnetoresistance element and the second magnetoresistance element can be a TMR element having a predetermined pillar diameter and a predetermined free layer thickness, both dimensions selected to provide a linear maximum response to the applied magnetic field parallel to the first reference direction.

According to a further aspect of the disclosure, a magnetic field sensor can include a semiconductor die having a surface, a concentrator layer disposed over the surface of the semiconductor die and having a plurality of apertures arranged in at least four sets of apertures, each aperture set including at least four apertures, each having a first edge and a second edge substantially parallel to the first edge, a plurality of sets of magnetoresistance elements, and processing circuitry. Each magnetoresistance element set can be associated with a different aperture set and include at least two magnetoresistance elements positioned adjacent to the first edge of the respective aperture and at least two magnetoresistance elements positioned adjacent to the second edge of the respective aperture, wherein, within a given aperture set, the at least two magnetoresistance elements positioned adjacent to the first edge are coupled together to form a first bridge element and the at least two magnetoresistance elements positioned adjacent to the second edge are coupled together to form a second bridge element, and wherein magnetoresistance elements associated with different aperture sets are coupled together to form a plurality of bridges. The processing circuitry can be coupled to the plurality of bridges to generate an output signal of the magnetic field sensor indicative of an angle of a puck magnet rotating in a plane above the magnetic field sensor. The concentrator layer can include a plurality of concentrator layers, each having a plurality of apertures arranged in one of the at least four sets of apertures.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
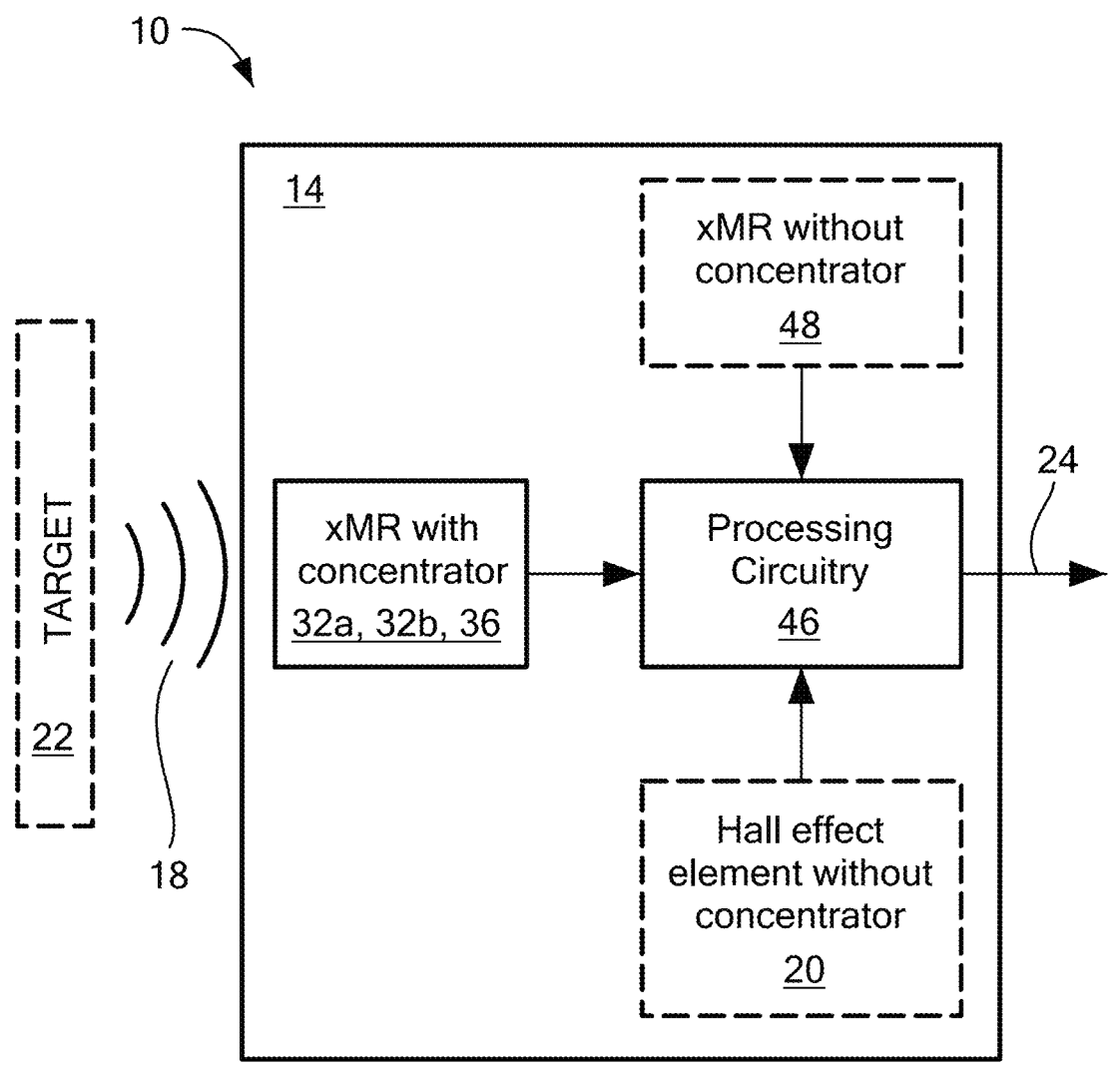
FIG. 1 is a block diagram of a magnetic field sensor system including a magnetoresistance element and concentrator arrangement according to the disclosure.
Figure 2:
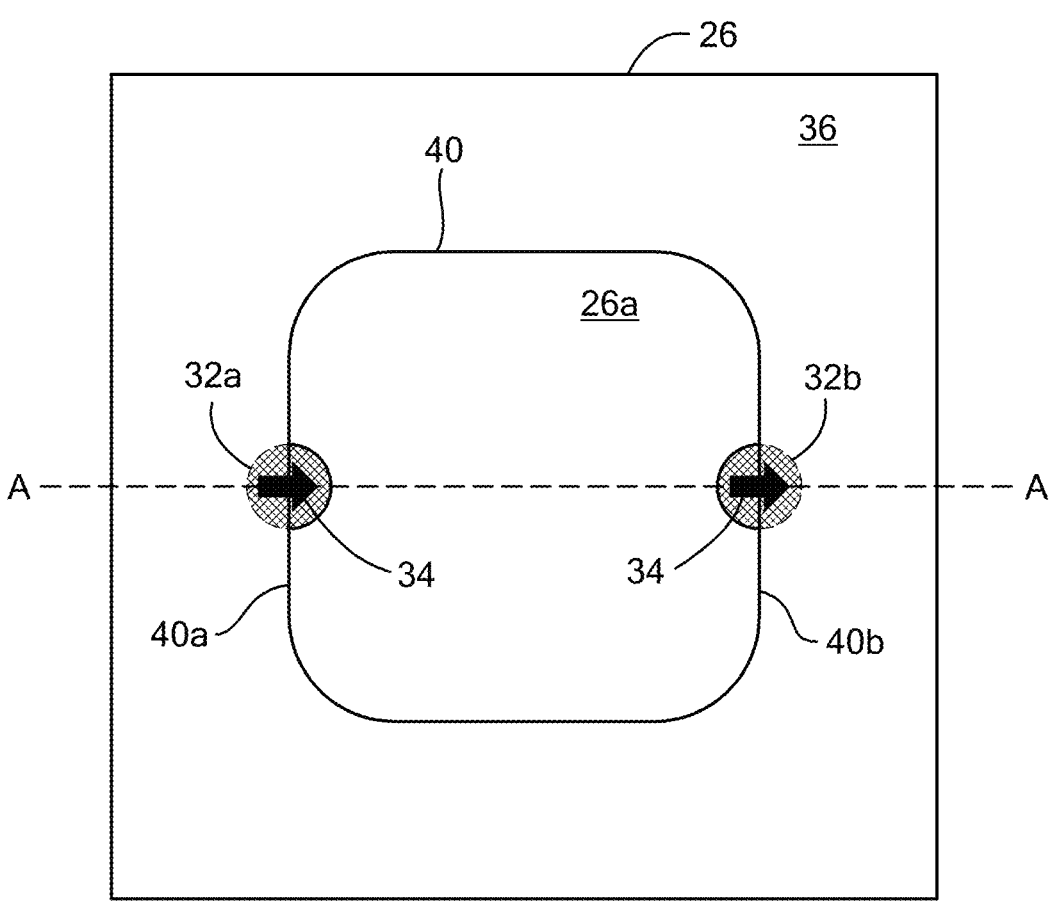
FIG. 2 is a top view of an example magnetoresistance element and concentrator arrangement according to the disclosure.

Referring to FIGS. 1 and 2, a magnetic field sensor system 10 includes a magnetic field sensor 14 arranged to sense a magnetic field 18 associated with a target 22. The magnetic field sensor 14 includes a semiconductor die 26 having a surface 26a that defines a plane of the semiconductor die, a first magnetoresistance, or MR element 32a supported by the semiconductor die, a second magnetoresistance, or MR element 32b supported by the surface of the semiconductor, and a concentrator layer 36 disposed over the surface of the semiconductor die and having an aperture 40. The concentrator aperture 40 has a first edge 40a and a second edge 40b substantially parallel to the first edge. The first magnetoresistance element 32a is positioned adjacent to the first edge 40a of the aperture and has a first reference direction parallel to the surface 26a of the semiconductor die 26 and substantially perpendicular to the first edge of the aperture. The second magnetoresistance element 32b is positioned adjacent to the second edge 40b of the aperture and has the first reference direction. In an example, the first reference direction can be represented by the arrows labeled 34 in elements 32a, 32b. It will be appreciated by those of ordinary skill in the art that while elements (e.g., MR elements 32a, 32b) are described herein as being supported by the surface of the semiconductor die, such elements generally are formed in or on layers of the die and can be covered in thin passivation.

With this arrangement, the concentrator layer 36 is configured to redirect the applied magnetic field 18 to present a differential magnetic field parallel to the plane of the semiconductor die 26 to the first and second magnetoresistance elements 32a, 32b in response to the applied magnetic field perpendicular to the plane of the semiconductor die, and to present a reduced magnitude and common mode magnetic field to the first and second magnetoresistance elements 32a, 32b in response to the applied magnetic field parallel to the plane of the semiconductor die. Magnetic field 18 can be referred to as a magnetic field of interest, an applied field, an external field, or a sensed field which the magnetic field sensor 14 is designed to sense.

The target 22 can take various forms, including but not limited to a gear having features including teeth and valleys, a ring magnet having magnetic domains of alternating polarities, a current carrying conductor, or a so-called "puck" magnet having a north magnetic pole and a south magnetic pole.

A bridge, or bridge circuit including an electrical coupling of the first and second magnetoresistance elements 32a, 32b is insensitive to applied magnetic field parallel to the plane of the semiconductor die (i.e., the "in-plane" magnetic field) and is sensitive to applied magnetic field perpendicular to the plane of the semiconductor die (i.e., the "out-of-plane" magnetic field). More particularly, an output signal 24 of the magnetic field sensor 14 generated by subtraction of signals from the first magnetoresistance element 32*a* and the second magnetoresistance element 32*b* is sensitive to the applied magnetic field perpendicular to the plane of the semiconductor die and insensitive to the applied magnetic field parallel to the plane of the semiconductor die. The significance of reducing the common mode in-plane field on the magnetoresistance elements 32*a*, 32*b* is that reduced common mode field advantageously prevents the elements from saturating.

Stated differently, while the MR elements 32*a*, 32*b* themselves are, by design, sensitive to in-plane magnetic field, the concentrator layer 36 changes the directions of the applied magnetic fields such that an applied out-of-plane field becomes an in-plane differential field with respect to the elements 32*a*, 32*b*. The concentrator layer 36 further shunts applied in-plane magnetic field away from the elements 32*a*, 32*b* through its low reluctance path. Advantageously the described arrangements permit use of highly sensitive MR elements to sense applied out-of-plane magnetic field in a manner that does not suffer from saturation due to applied in-plane common mode magnetic field, since such applied in-plane common mode field is shunted by the concentrator layer.

The magnetic field sensor 14 is suitable for applications for which applied out-of-plane magnetic field sensing is required (e.g., applications that use planar Hall effect elements) and in which applied in-plane field can be present, but which applications require higher sensing sensitivity as can be achieved with magnetoresistance elements. Example, but non-limiting applications include angle sensors and current sensors. In the case of current sensors, the first and second magnetoresistance elements can be configured to sense a magnetic field generated by a current through a conductor.

The term "xMR" is used herein to refer to any type of magnetoresistance element. Examples include but are not limited to tunnel magnetoresistive (TMR) elements, giant magnetoresistance (GMR) elements, anisotropic magnetoresistance (AMR) elements, magnetic tunnel junction (MTJ) elements, or other suitable type of magnetoresistance element. It will be appreciated by those of ordinary skill in the art that TMR elements may interchangeably be referred to as so-called "pillars".

The concentrator layer 36 (as may be referred to alternatively as flux concentrator or more generally as concentrator 36) can be comprised of various materials suitable to present a low reluctance path to an applied magnetic field 18. Example materials include, but are not limited to NiFe. Example thickness of the concentrator layer 36 can be on the order of 5 microns but can be varied to suit manufacturing and performance requirements. Fabrication techniques for providing concentrator layer 36 include but are not limited to electrodeposition and/or sputtering.

Additional optional elements of sensor 14 include one or more magnetoresistance elements without a concentrator as represented by block 48 and one or more Hall effect elements without a concentrator as represented by block 20. It will be appreciated by those of ordinary skill in the art that the MR elements of block 48 can sense in-plane magnetic fields and the Hall effect elements of block 20 (presuming planar Hall effect element) can sense out-of-plane magnetic fields.

Block 20 can be useful in heterogeneous sensing applications in which out-of-plane magnetic fields are sensed by different types of magnetic field sensing elements; namely Hall effect elements of block 20 and MR elements of block 48. Heterogeneous sensing can be advantageous in some applications for safety specification compliance.

Multi-dimensional sensing applications, including two-dimensional sensing and three-dimensional sensing, can benefit from use of block 48 in which the MR elements of this block are configured to sense in-plane applied magnetic fields. An example of three-dimensional sensing in this manner is described in connection with FIGS. 9, 9A and 9B.

Sensor 14 includes processing circuitry 46 configured to process signals from the magnetoresistance elements 32*a*, 32*b* and generate a sensor output signal 24. In sensor embodiments without optional blocks 48, 20, the sensor output signal 24 is indicative of out-of-plane applied magnetic fields, whereas in embodiments containing additional block 48, the senor output signal 24 can additionally be indicative of in-plane applied magnetic fields.

Figure 5B:
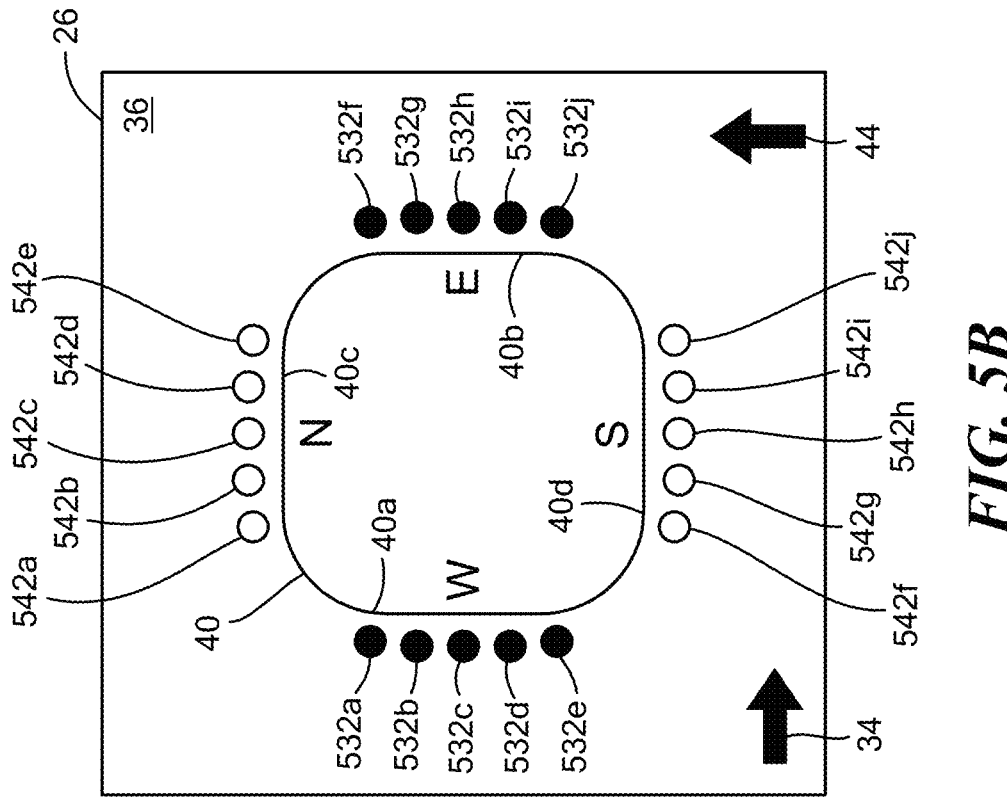
FIG. 5B is a top view of yet another alternative magnetoresistance element and concentrator arrangement according to the disclosure.
Figure 5A:
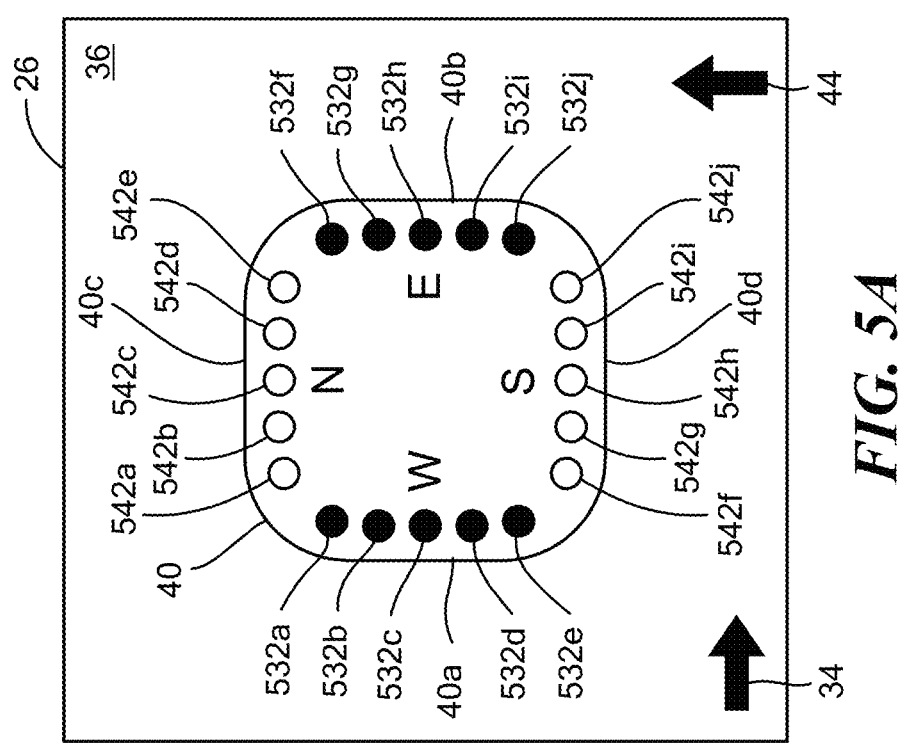
FIG. 5A is a top view of another alternative magnetoresistance element and concentrator arrangement according to the disclosure.
Figure 6B:
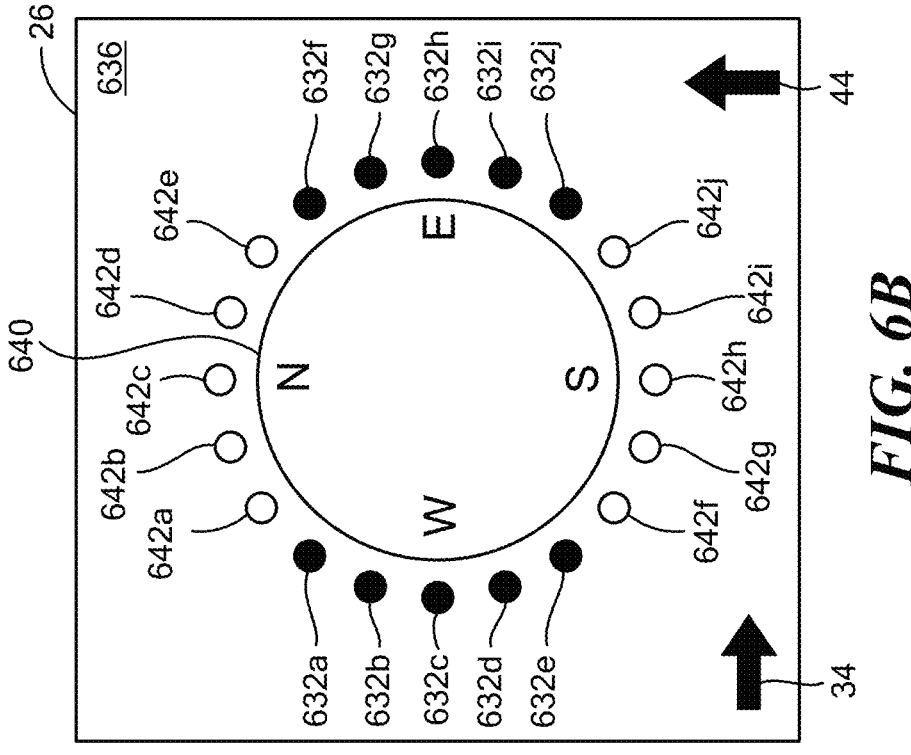
FIG. 6B is a top view of yet another alternative magnetoresistance element and concentrator arrangement according to the disclosure.
Figure 6A:
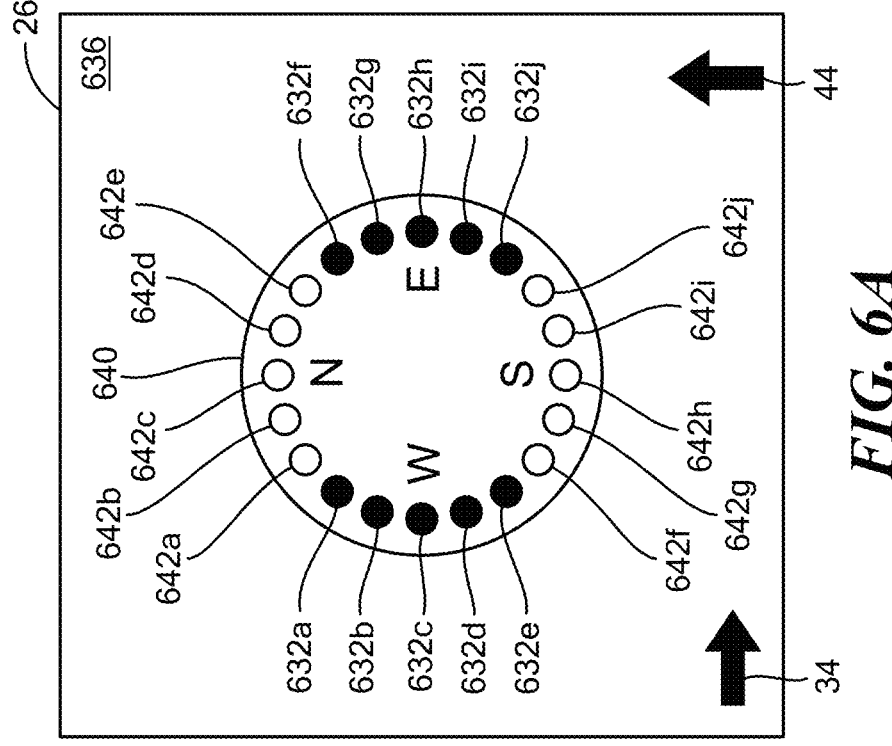
FIG. 6A is a top view of another alternative magnetoresistance element and concentrator arrangement according to the disclosure.

The plan view structure of FIG. 2 illustrates the magnetoresistance elements 32*a*, 32*b* disposed partially inside a periphery of the concentrator aperture 40 and partially outside the periphery of the concentrator aperture. Other positioning of the magnetoresistance elements 32*a*, 32*b* with respect to the periphery of the concentrator aperture 40 are possible. For example, in some embodiments the magnetoresistance elements can be entirely inside the periphery of the concentrator aperture as illustrated in FIGS. 5A and 6A and in some embodiments the magnetoresistance elements can be entirely outside of the periphery of the concentrator aperture as illustrated in FIGS. 5B and 6B.

Figure 2A:
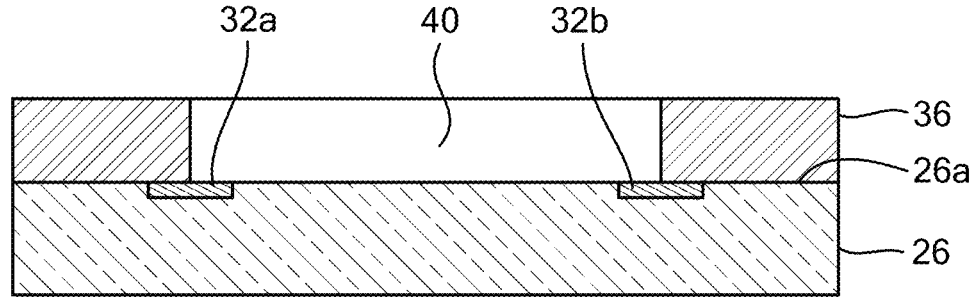
FIG. 2A is a cross-sectional view of the example magnetoresistance element and concentrator arrangement taken along line A-A of FIG. 2.
Figure 2B:
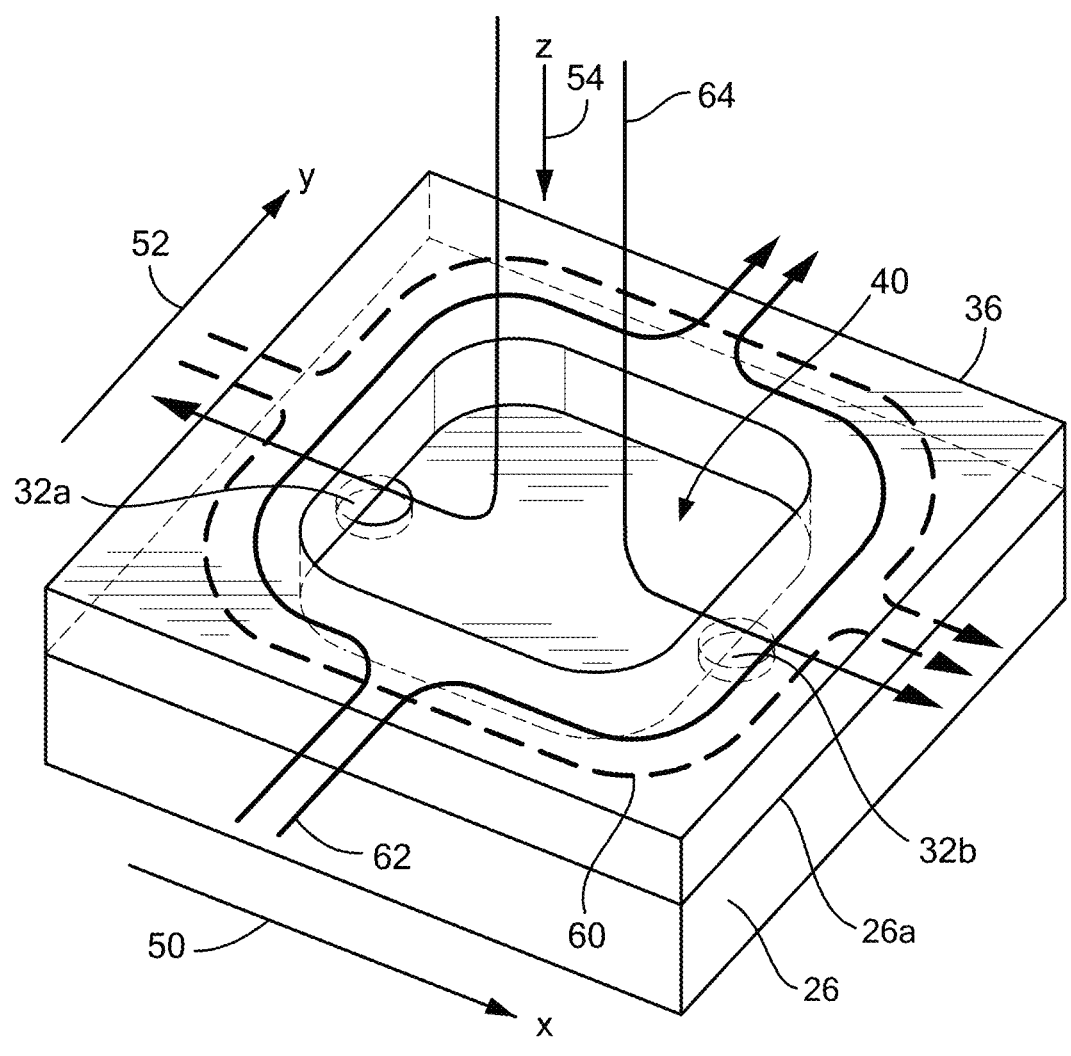
FIG. 2B is a perspective view of the example magnetoresistance element and concentrator arrangement of FIG. 2A.

The structure of FIG. 2 can have the concentrator layer 36 disposed on the surface 26*a* of the semiconductor die 26, as shown in FIGS. 2A and 2B. Alternatively, an insulator 70 can be provided and the concentrator layer 36 can be disposed on the insulator, as shown in FIGS. 2C and 2D.

Referring to FIGS. 2A and 2B, the concentrator layer 36 can be disposed on the surface 26*a* of the semiconductor die 26 and over, or above a portion of magnetoresistance elements 32*a*, 32*b* to provide the elements 32*a*, 32*b* partially inside the periphery of the concentrator aperture 40 and partially outside the periphery of the concentrator aperture, as shown. Although the concentrator layer 36 is shown to cover approximately half of each MR element 32*a*, 32*b*, the concentrator layer could cover more or less of the elements.

As labeled in FIG. 2B, the plane of semiconductor die 26 defined by the surface 26*a* is formed by an x-axis or x-direction 50 and a y-axis or y-direction 52. A z-axis or z-direction 54 is perpendicular to the die surface 26*a*. Field lines 60 illustrate an applied x-axis magnetic field shunted by the concentrator layer 36 and field lines 62 illustrate an applied y-axis magnetic field shunted by the concentrator layer 36. Also shown are field lines 64 from an applied z-axis magnetic field that are redirected by the concentrator layer 36 to present an in-plane differential applied magnetic field to the sensing elements 32*a*, 32*b*.

Figure 2C:
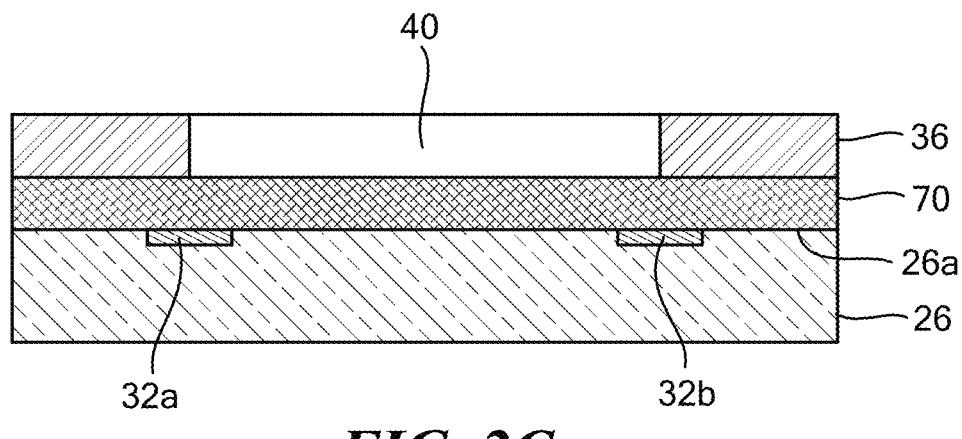
FIG. 2C is a cross-sectional view of an alternative example magnetoresistance element and concentrator arrangement taken along line A-A of FIG. 2.
Figure 2D:
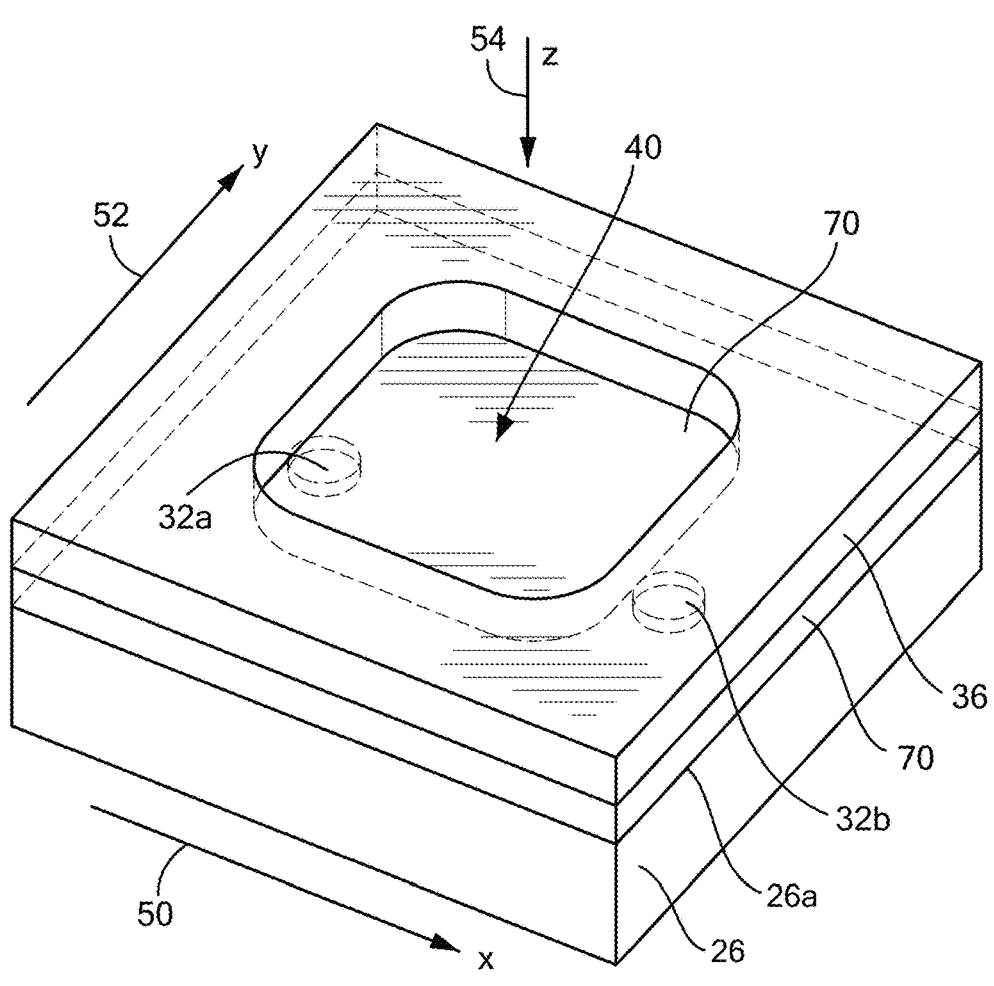
FIG. 2D is a perspective view of the alternative example magnetoresistance element and concentrator arrangement of FIG. 2C.

Referring to FIGS. 2C and 2D, the structure of FIG. 2 can include insulator 70 disposed on the surface 26*a* of the semiconductor die 26, with the concentrator layer 36 disposed over the insulator. The insulator 70 can be disposed on the surface 26*a* of the semiconductor die 26 over, or above a portion of magnetoresistance elements 32*a*, 32*b*. Although the insulator 70 is shown to cover approximately half of each MR element 32a, 32b, the insulator could cover more or less of the elements.

FIGS. 2C and 2D show the concentrator layer 36 is disposed over the same extent of the magnetoresistance elements 32a, 32b as the insulator 70 or, in other words, shows the concentrator layer 36 extending to, but not further than the periphery of the insulator. It will be appreciated by those of ordinary skill in the art that the insulator 70 and concentrator layer 36 need not have the same overlap with the elements 32a, 32b.

The insulator 70 can be comprised of various materials, such as $Si_3N_4$, $SiO_2$, $Al_2O_3$ and can have various thicknesses, such as on the order of 10 nm up to several microns.

Figure 2E:
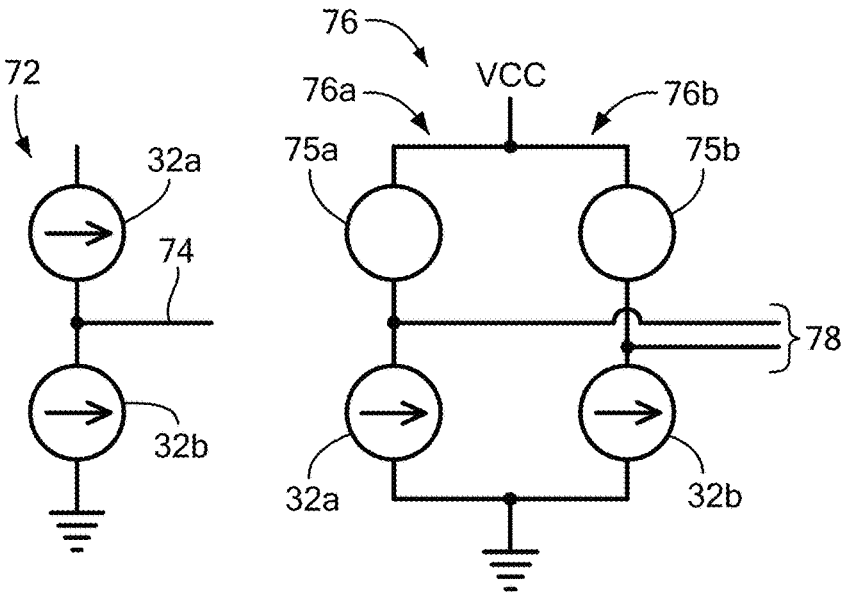
FIG. 2E illustrates example half-bridge configurations of the magnetoresistance elements of FIG. 2.

Referring to FIG. 2E, an electrical coupling arrangement of MR elements 32a, 32b provides a half-bridge circuit 72, with the elements coupled in series between a power connection VCC and ground. The output 74 of the half-bridge arrangement 72 provides an indication of applied out-of-plane magnetic fields.

As is known by those of ordinary skill in the art, MR elements include a substrate having a reference layer formed thereon. Over the reference layer, a free layer may be formed that is separated from the reference layer by a spacer. Both the reference layer and the free layer are magnetic layers, and the layered arrangement of an MR element can be referred to as the MR stack. It will be appreciated by those of ordinary skill in the art that the above-described stack arrangement could be inverted (i.e., upside down). The orientation of magnetization of the reference layer is fixed and intended to be co-linear with the field to be sensed, whereas the orientation of magnetization of the free layer will freely align with a magnetic field of the surrounding environment. The resistance of an MR element is proportional to the cosine of the angle of magnetization of the free layer relative to one in the reference layer. When the free layer and the reference layer have the same orientation of magnetization, the resistance of the MR element is at its lowest; whereas when the reference layer and the free layer have opposite orientations of magnetization, the resistance of the MR element is at its highest.

The term "pinning direction" or "reference direction" of an MR element refers to the orientation of magnetization of a reference layer (or reference layers) of the MR element. The pinning direction of an MR element determines whether the resistance of the MR element increases or decreases when the MR element is subjected to a magnetic field having a particular orientation, or angle, with respect to such reference layer pinning. In particular, when considering a magnetic field co-linear with the reference direction, if the magnetic field opposes the magnetic reference direction, then the resistance of the element increases with an increase in the sensed magnetic field strength; whereas, if the magnetic field is aligned with the reference direction, then the resistance of the element decreases with an increase in the magnetic field strength.

Since both MR elements 32a, 32b have the same reference direction shown by the arrows 34 within the elements, the resistance of one such element will increase with an increase in the applied out-of-plane magnetic field 64 (FIG. 2B) that has been redirected, or translated into an in-plane differential field at the elements 32a, 32b and the resistance of the other element will decrease with the increase in the applied out-of-plane magnetic field 64 that has been redirected, or translated into an in-plane field at the elements 32a, 32b. Thus, an increase in the applied out-of-plane magnetic field 64 will cause the output 78 of circuit 74 to increase and a decrease in the applied out-of-plane magnetic field 64 will cause the output 78 to decrease.

In an alternative bridge 76, each magnetoresistance element 32a, 32b is coupled in series with a respective current source 75a, 75b to form a respective bridge leg and the two bridge legs are coupled in parallel between power connection VCC and ground, as shown. Thus, each bridge leg 76a, 76b is driven by a different respective current source 75a, 75b. A differential output signal 78 of bridge 76 provides an indication of applied out-of-plane magnetic field 64.

Subtraction of the signals from the intermediate nodes of the two bridge legs yields a differential signal 78 that increases with increasing applied out-of-plane magnetic field and decreases with decreasing applied out-of-plane magnetic field. In this way, the differential bridge output signal 78 is sensitive to the applied magnetic field perpendicular to the plane of the semiconductor die and is insensitive to the applied magnetic field parallel to the plane of the semiconductor die (i.e., since such parallel magnetic field is shunted by the concentrator and rejected by the bridge).

It will be appreciated by those of ordinary skill in the art that the current half bridge 76 is one of various possible bridge configurations including magnetoresistance elements 32a, 32b that yield a differential signal, like signal 78, with which applied magnetic field perpendicular to the plane of the semiconductor die 26a can be measured. Alternative bridge configurations can be half bridge or full bridge configurations.

Figure 3:
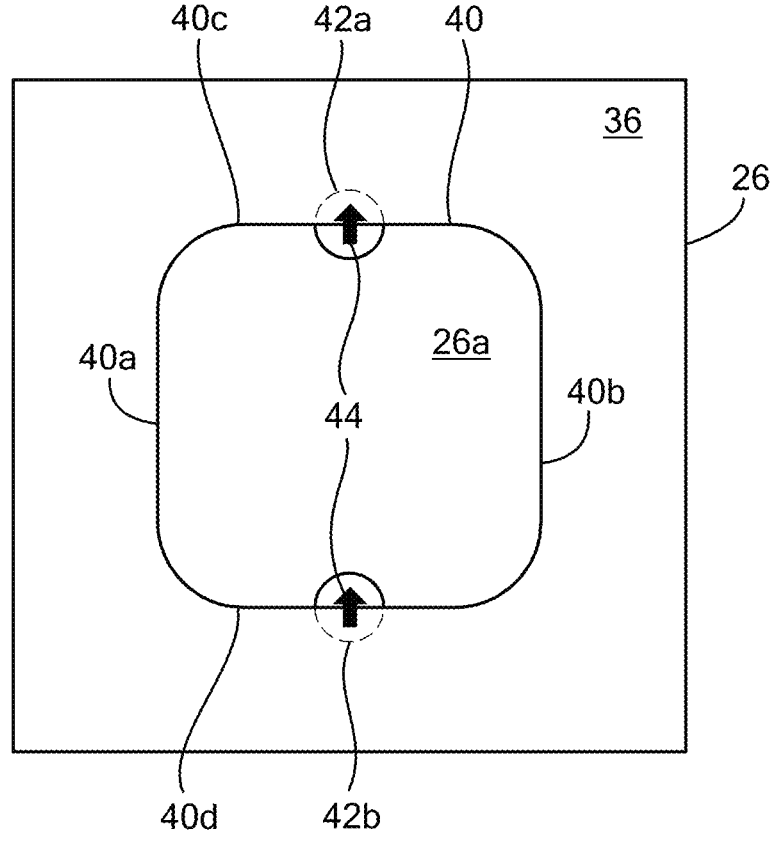
FIG. 3 is a top view of an alternative magnetoresistance element and concentrator arrangement according to the disclosure.

Referring to FIG. 3, an alternative arrangement includes semiconductor die 26 having surface 26a that defines a plane of the semiconductor die and concentrator layer 36 disposed over the surface of the semiconductor die and having aperture 40. Additional edges of the concentrator aperture 40 (in addition to the first edge 40a and the second edge 40b) are labeled including a third edge 40c substantially perpendicular to the first edge 40a and the second edge 40b and further including a fourth edge 40d substantially parallel to the third edge 40c.

Magnetoresistance elements 42a, 42b (as may be referred to herein as third and fourth magnetoresistance elements, respectively, in order to differentiate from the first and second elements 32a, 32b of FIGS. 2-2D) are positioned adjacent to the third and fourth aperture edges, with the third element 42a adjacent to the third aperture edge 40c and the fourth element 42b adjacent to the fourth aperture edge 40d. The element 42a has a reference direction (as may be referred to herein as the second reference direction in order to differentiate from the first reference direction of elements 32a, 32b) that is substantially perpendicular to the third aperture edge 40c and the element 42b also has the second reference direction. In an example, the second reference direction can be represented by the arrows labeled 44 in elements 42a, 42b.

The magnetoresistance elements 42a, 42b can be electrically coupled in either of the bridge arrangements shown in FIG. 2E. Having the same reference direction 44 as each other, the resistance of one such element 42a, 42b will increase with an increase in the applied out-of-plane magnetic field that has been redirected by concentrator layer 36 and the resistance of the other of elements 42a, 42b will decrease with the increase in the applied out-of-plane magnetic field that has been redirected by the concentrator layer 36. For example, if elements 32a, 32b in the full bridge 76 of FIG. 2E are replaced with elements 42a, 42b, subtraction of the signals from the two legs of the bridge to form a differential output signal like signal 78 will be indicative of the applied out-of-plane magnetic field.

Figures 4, 4A:
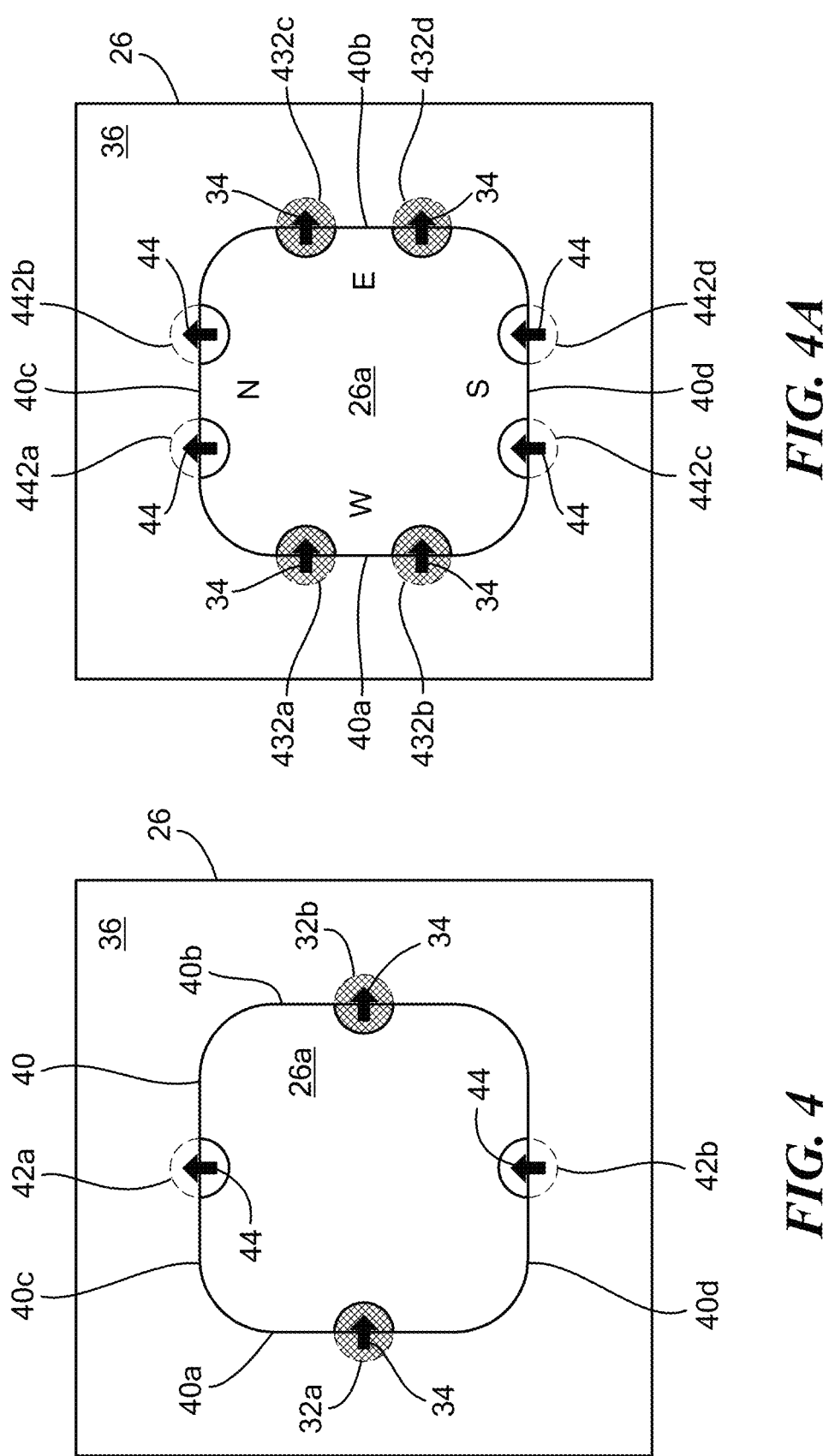
FIG. 4 is a top view of another alternative magnetoresistance element and concentrator arrangement according to the disclosure.
FIG. 4A is a top view of another alternative magnetoresistance element and concentrator arrangement according to the disclosure.

Referring also to FIG. 4, an alternative magnetoresistance element and concentrator arrangement includes magnetoresistance elements adjacent to each edge 40*a*, 40*b*, 40*c*, and 40*d* of the concentrator aperture 40. Like the above-described configurations, concentrator layer 36 is disposed over a surface 26*a* of semiconductor die 26 and has aperture 40.

In this configuration, first and second magnetoresistance elements 32*a*, 32*b* are positioned adjacent to respective parallel edges 40*a*, 40*b* of the aperture 40 of the concentrator layer 36 in the same manner as FIG. 2 and third and fourth magnetoresistance elements 42*a*, 42*b* are positioned adjacent to respective parallel edges 40*c*, 40*d* of the aperture 40 in the same manner as FIG. 3. Thus, the first and second elements 32*a*, 32*b* have the first reference direction 34 and the third and fourth elements 42*a*, 42*b* have the second reference direction 44.

The elements 32*a*, 32*b* can be coupled in a full bridge like bridge 76 of FIG. 2E and the elements 42*a*, 42*b* also can be coupled in a separate full bridge like bridge 76. Use of two such bridges can be advantageous to improve rejection of the applied in-plane magnetic field. For example, in applications in which there is some sensitivity to in-plane applied magnetic fields (i.e., the rejection of the in-plane applied field is not complete by the concentrator shunting), differential signals from two such bridges, which signals should be identical but which are not, can be processed in order to improve rejection of the in-plane applied field. For example, in some instances, it may be desirable to average the signals from the two bridges.

Referring to FIG. 4A, another alternative magnetoresistance element and concentrator arrangement includes a plurality of sensing elements adjacent to each edge 40*a*-40*d* of the concentrator aperture 40. Like the above-described configurations, concentrator layer 36 is disposed over surface 26*a* of semiconductor die 26 and has aperture 40.

In this configuration, two magnetoresistance elements 432*a*, 432*b* are positioned adjacent to aperture edge 40*a* (which edge 40*a* can be referred to as a left, or west edge of aperture 40 as labeled "W" and which elements 432*a*, 432*b* can be referred to as west elements), two magnetoresistance elements 432*c*, 432*d* are positioned adjacent to aperture edge 40*b* (which edge 40*b* can be referred to as a right, or east edge of aperture 40 as labeled "E" and which elements 432*c*, 432*d* can be referred to as east elements), two magnetoresistance elements 442*a*, 442*b* are positioned adjacent to aperture edge 40*c* (which edge 40*c* can be referred to as a top, or north edge of aperture 40 as labeled "N" and which elements 442*a*, 442*b* can be referred to as north elements), and two magnetoresistance elements 442*c*, 442*d* are positioned adjacent to aperture edge 40*d* (which edge 40*b* can be referred to as a bottom, or south edge of aperture 40 as labeled "S" and which elements 442*c*, 442*d* can be referred to as south elements). Elements 432*a*-432*d* have the first reference direction labeled 34 and elements 442*a*-442*d* have the second reference direction labeled 44. It will be appreciated by those of ordinary skill in the art that more than two magnetoresistance elements can be positioned adjacent to each aperture edge as shown in FIGS. 5A, 5B, 6A, and 6B for example.

Figure 4B:
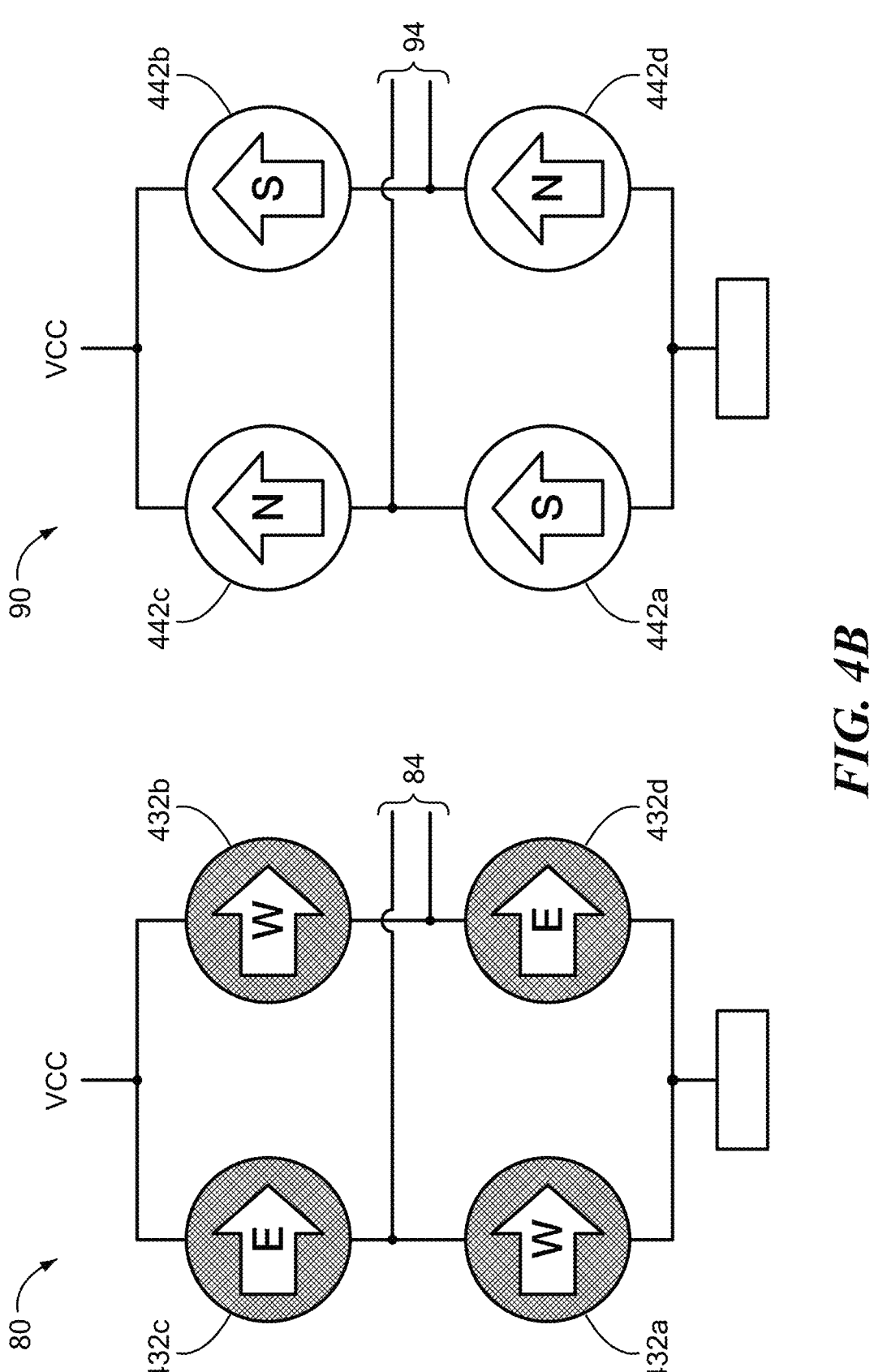
FIG. 4B illustrates a full bridge configuration showing different example reference directions of the magnetoresistance elements of FIG. 4.

Referring to FIG. 4B, an example electrical coupling of the elements 432*a*-432*d* of FIG. 4A forms a full bridge 80 and an example electrical coupling of the elements 442*a*-442*d* of FIG. 4A forms a full bridge 90.

Full bridge 80 includes a first leg of elements 432*c* and 432*a* coupled in series between a power connection VCC and ground and a second leg of elements 432*b*, 432*d* coupled between VCC and ground, with the first and second legs coupled in parallel. A differential output signal 84 of bridge 80 is taken between the elements 432*c*, 432*a* and between elements 432*b*, 432*d*, as shown. In bridge 80, the "west" elements 432*a*, 432*b* are diagonally arranged with respect to each other and the "east" elements 432*c*, 432*d* are diagonally arranged with respect to each other. This coupling provides a so-called "gradiometer" with which the differential signal 84 is indicative of the out-of-plane applied magnetic field. In other words, the output signal 84 varies with variations in the strength of the out-of-plane magnetic field that is differentially experienced by the sensing elements 432*a*, 432*b* and sensing elements 432*c*, 432*d*. Stated differently, gradiometer bridge 80 senses a differential magnetic field between the bridge elements 432*a*, 432*b* and bridge elements 432*c*, 432*d* and cancels uniform field effects on the elements. By "uniform" it is meant that the sensed field has the same magnitude and direction with respect to all of the elements.

Full bridge 90 includes a first leg of elements 442*c* and 442*a* coupled in series between a power connection VCC and ground and a second leg of elements 442*b*, 442*d* coupled between VCC and ground, with the first and second legs coupled in parallel. A differential output signal 94 of bridge 90 is taken between the elements 442*c*, 442*a* and between elements 442*b*, 442*d*, as shown. In bridge 90, the "north" elements 442*a*, 442*b* are diagonally arranged with respect to each other and the "south" elements 442*c*, 442*d* are diagonally arranged with respect to each other. This coupling provides a gradiometer in the sense that the differential signal 94 is indicative of the out-of-plane applied magnetic field and the in-plane uniform field cancels. It will be appreciated by those of ordinary skill in the art that bridges 80, 90 could be driven differently than as shown.

In embodiments, it can be advantageous to use both bridges 80 and 90 in an application in which there is some sensitivity to in-plane applied magnetic fields (i.e., the rejection of the in-plane applied field is not complete by the concentrator shunting). In such applications, differential signals 84, 94, which signals should be identical but are not, can be processed in order to improved rejection of the in-plane applied field. For example, in some instances, it may be desirable to average the signals from the two bridges 80, 90.

Referring to FIG. 5A, an example of an alternative magnetoresistance element and concentrator arrangement includes more than two magnetoresistance elements positioned adjacent to each aperture edge 40*a*, 40*b*, 40*c*, 40*d*. Like above-described configurations, concentrator layer 36 is disposed over semiconductor die 26 and has aperture 40. Further, the magnetoresistance elements of FIG. 5A are positioned entirely within, or inside the periphery of aperture 40.

In the illustrated example, five magnetoresistance elements 532*a*, 532*b*, 532*c*, 532*d*, 532*e* are positioned adjacent to west aperture edge 40*a* and five magnetoresistance elements 532*f*, 532*g*, 532*h*, 532*i*, 532*j* are positioned adjacent to east aperture edge 40*b*, each with the first reference direction illustrated by arrow 34. Further, five magnetoresistance elements 542*a*, 542*b*, 542*c*, 542*d*, 542*e* are positioned adjacent to north aperture edge 40*c* and five magnetoresistance elements 542*f*, 542*g*, 542*h*, 542*i*, 542*j* are positioned adjacent to south aperture edge 40*d*, each with the second reference direction illustrated by arrow 44.

The magnetoresistance elements 532*a*-532*e* adjacent to aperture edge 40*a* and the magnetoresistance elements 542*a*-542*e* adjacent to aperture edge 40*b* can be electrically coupled to form a full bridge. For example, elements 532*a*, 532*c*, 532*e* can be coupled together to provide a top left element of a bridge (i.e., positioned like element 432*c* of bridge 80 of FIG. 4B), elements 532*b*, 532*d* can be coupled together to provide a bottom right element of the bridge (i.e., positioned like element 432*d* of bridge 80 of FIG. 4B), elements 532*f*, 532*h*, 532*j* can be coupled together to provide a top right element of the bridge (i.e., positioned like element 432*b* of bridge 80 of FIG. 4B), and elements 532*g*, 532*i* can be coupled together to form a bottom left element of the bridge (i.e., positioned like element 432*a* of bridge 80 of FIG. 4B). With this arrangement, west elements 532*a*, 532*c*, 532*e* are diagonally arranged with respect to other west elements 532*b*, 532*d* and east elements 532*f*, 532*h*, 532*j* are diagonally arranged with respect to other east elements 532*g*, 532*i*. As explained above in connection with FIG. 4B, this coupling provides a gradiometer in the sense that the resulting differential signal 84 is indicative of the out-of-plane applied magnetic field that has been redirected by concentrator layer 36. It will be appreciated by those of ordinary skill in the art that other numbers of pillars and/or grouping arrangements of pillars are possible to form bridge elements and bridge configurations. For example, pillars can split by arrangements of (n−1)/2 and (n+1)/2 (where "n" is the number of pillars per aperture edge) and groupings of pillars can include pillars from every other aperture so that the average the number of pillars is n/2 per group and per aperture. As another example, all of the pillars of one aperture can be used to form one element and pillars from every other aperture can be used for another element of the bridge.

Positioning the magnetoresistance elements 532*a*-532*j*, 542*a*-542*j* inside the periphery of the aperture 40 can yield higher sensitivity magnetic field sensing (as compared to the elements being positioned outside of the aperture periphery or even partially inside and partially outside the periphery) because there will be more fringing of the field lines by the concentrator layer 36 at the location of the elements.

Referring to FIG. 5B, another example magnetoresistance element and concentrator arrangement includes the same numbers of elements positioned adjacent to the same edges of the concentrator layer aperture 40 as in FIG. 5A. Specifically, magnetoresistance elements 532*a*, 532*b*, 532*c*, 532*d*, 532*e* are positioned adjacent to west aperture edge 40*a* and magnetoresistance elements 532*f*, 532*g*, 532*h*, 532*i*, 532*j* are positioned adjacent to east aperture edge 40*b*, each with the first reference direction illustrated by arrow 34. Further, magnetoresistance elements 542*a*, 542*b*, 542*c*, 542*d*, 542*e* are positioned adjacent to north aperture edge 40*c* and magnetoresistance elements 542*f*, 542*g*, 542*h*, 542*i*, 542*j* are positioned adjacent to south aperture edge 40*d*, each with the second reference direction illustrated by arrow 44.

The arrangement of FIG. 5B differs from that of FIG. 5A in that the magnetoresistance elements are positioned outside of the periphery of aperture 40. In other words, the magnetoresistance elements are entirely covered by the concentrator layer 36. Positioning the magnetoresistance elements outside of the periphery of the aperture 40 can yield lower sensitivity magnetic field sensing (as compared to the elements being positioned inside of the aperture periphery or even partially inside and partially outside the periphery) because there will be less fringing of the field lines by the concentrator layer 36 at the location of the elements. As noted above, described arrangements are not limited to any particular number or configuration or grouping of pillars. As another example, it is possible to provide apertures with more pillars than illustrated, such as several columns of east and west pillars, where one or more columns could be as shown in FIG. 5B, one or more columns could be as shown in FIG. 4A, and one or more columns could be as shown in FIG. 5A.

Referring to FIG. 6A, an alternative magnetoresistance element and concentrator arrangement illustrates a differently shaped aperture in the concentrator layer. Like above-described configurations, a concentrator layer 636 is disposed over semiconductor die 26 and has an aperture 640. The concentrator layer 636 can be the same as or similar to concentrator layer 36 and aperture 640 can be the same as or similar to aperture 40 except for its shape. Unlike aperture 40 that has a generally square shape with rounded corners, aperture 640 is substantially circular in shape. Aperture shape can be designed based on the number of pillars to fit the size of the apertures and need to shield the in-plane field. In general, apertures with squared corners have less ability to screen the in-plane field than apertures that are rounded or filleted at corner areas.

A plurality of magnetoresistance elements 632*a*-632*e* are positioned adjacent to a left, or west edge of the aperture 640 and a plurality of magnetoresistance elements 632*f*-632*j* are positioned adjacent to a right, or east edge of the aperture. Magnetoresistance elements 632*a*-632*j* can have the first reference direction illustrated by arrow 34.

A plurality of magnetoresistance elements 642*a*-642*e* are positioned adjacent to a top, or north edge of the aperture 640 and a plurality of magnetoresistance elements 642*f*-642*j* are positioned adjacent to a bottom, or south edge of the aperture. Magnetoresistance elements 642*a*-642*j* can have the second reference direction illustrated by arrow 44.

It will be appreciated by those of ordinary skill in the art that aperture shapes other than the square shape with rounded corners of aperture 40 or the circular shape of aperture 640 are possible. Additional non-limiting examples of aperture shapes include an ellipse or rectangle.

The magnetoresistance elements 632*a*-632*j* and 642*a*-642*j* are positioned inside the periphery of aperture 640. As explained above, this element positioning relative to the concentrator aperture periphery can provide higher sensitivity than other arrangements.

Referring also to FIG. 6B, another alternative magnetoresistance element and concentrator arrangement illustrates the same numbers of elements positioned adjacent to the same sides of the concentrator layer aperture 640 as in FIG. 6A. Specifically, magnetoresistance elements 632*a*-632*e* are positioned adjacent to a left, or west edge of the aperture 640 and magnetoresistance elements 632*f*-632*j* are positioned adjacent to a right, or east edge of the aperture. Magnetoresistance elements 632*a*-632*j* can have the first reference direction illustrated by arrow 34. Further, magnetoresistance elements 642*a*-642*e* are positioned adjacent to a top, or north edge of the aperture 640 and magnetoresistance elements 642*f*-642*j* are positioned adjacent to a bottom, or south edge of the aperture. Magnetoresistance elements 642*a*-642*j* can have the second reference direction illustrated by arrow 44.

The arrangement of FIG. 6B differs from that of FIG. 6A in that the magnetoresistance elements are positioned outside of the periphery of aperture 640. In other words, the magnetoresistance elements are entirely covered by the concentrator layer 636. Positioning the magnetoresistance elements outside of the periphery of the aperture 640 can yield lower sensitivity magnetic field sensing (as compared to the elements being positioned inside of the aperture periphery or even partially inside and partially outside the periphery) because there will be less fringing of the field lines by the concentrator layer 636 at the location of the elements.

Figure 7:
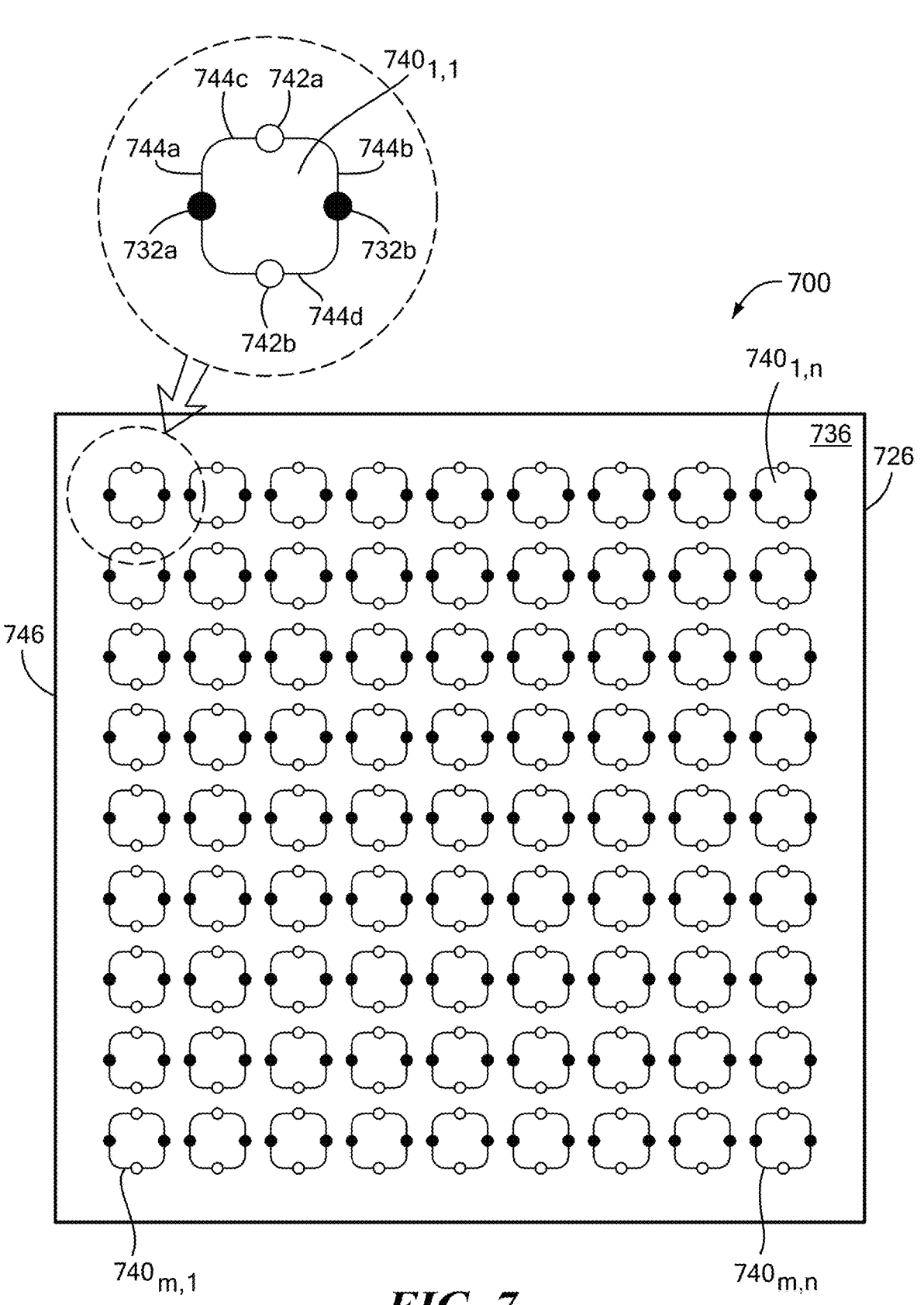
FIG. 7 is a top view of another alternative magnetoresistance element and concentrator arrangement including a grid configuration of concentrator apertures according to the disclosure.

Referring to FIG. 7, a magnetoresistance element and concentrator arrangement 700 includes a concentrator layer 736 disposed over a semiconductor die 726, with the concentrator layer having a plurality of apertures (referred to generally as apertures 740). In embodiments, the apertures 740 form a grid, or matrix arrangement of apertures $740_{1,1}$-$740_{m,n}$ where m is the number of rows and n is the number of columns in the grid. It is not required that there be the same number of rows and columns of apertures, although in the illustrated example m=n=9.

In the illustrated example, each of the apertures 740 has a substantially square shape with rounded corners. It will be appreciated by those of ordinary skill in the art that other aperture shapes are possible as explained above.

Each aperture (as labeled for example aperture $740_{1,1}$) can be described as having a first edge 744_a_ on a west or left side of the aperture, a second edge 744_b_ on an east or right side of the aperture, a third edge 744_c_ on a north or top side of the aperture, and a fourth edge 744_d_ on a south or bottom side of the aperture.

As is further labeled in connection with example aperture $740_{1,1}$, at least one magnetoresistance first element 732_a_ can be positioned adjacent to the west edge 744_a_ of each aperture, at least one second magnetoresistance element 732_b_ can be positioned adjacent to the east edge 744_b_ of each aperture, at least one third magnetoresistance element 742_a_ can be positioned adjacent to the north edge 744_c_ of each aperture, and at least one fourth magnetoresistance element 742_b_ can be positioned adjacent to the south edge 744_d_ of each aperture. While the example of FIG. 7 illustrates just one magnetoresistance element adjacent to each aperture edge, there may be more than one element adjacent to each aperture edge as explained above.

In FIG. 7, the grid of apertures $740_{1,1}$-$740_{m,n}$ has an overall square shape, as shown by its outer periphery, or edge labeled 746. It will be appreciated by those of ordinary skill in the art that the grid may have other overall shapes, such as a square, an ellipse, a circle, or a rectangle.

A distance between the closest one of the apertures $740_{1,1}$-$740_{m,n}$ to the outer edge 746 of the concentrator layer 736 can be larger than a spacing between adjacent apertures of the plurality of apertures, as shown. For example, a distance from aperture $740_{1,1}$ to the adjacent periphery edge 746 of the concentrator 736 is larger than a distance between aperture $740_{1,1}$ and adjacent aperture $740_{1,2}$, as shown.

Each of the m rows of apertures $740_{1,1}$-$740_{m,n}$ can be spaced apart from each other by the same distance that each of the n columns is spaced apart from each other as shown. Alternatively, a spacing between adjacent rows of the grid can be different than a spacing between adjacent columns of the grid. Furthermore, each of the m rows of apertures can be spaced from adjacent rows by the same or a different amount and each of the n columns of apertures can be spaced from adjacent columns by the same or a different amount. Thus, it will be appreciated by those of ordinary skill in the art that the arrangements described herein are not limited to any particular spacing between aperture rows of the grid arrangement or any particular spacing between aperture columns of the grid arrangement.

It will be appreciated by those of ordinary skill in the art that the aperture grid configuration and detail (including but not limited to inter-row spacing between aperture rows, inter-column spacing between aperture columns, aperture size, and aperture shape) can be varied and in general, are designed to suit the application.

Figure 8:
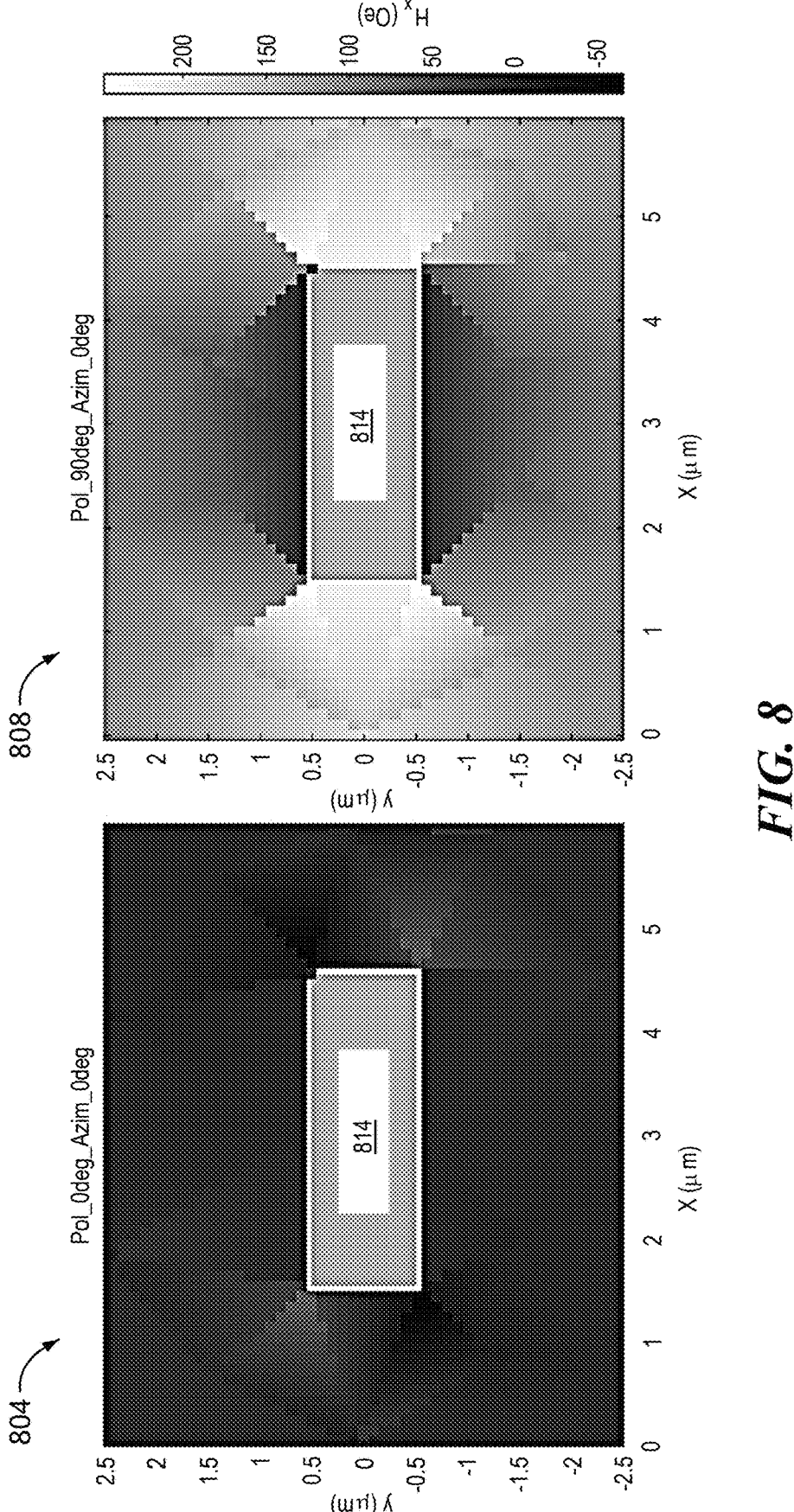
FIG. 8 shows a map illustrating the response in the x-direction to a magnetic field in the z-direction and a map illustrating the response in the x-direction to a magnetic field in the x-direction.

FIG. 8 shows a map 804 illustrating the intensity of field in the x-axis (i.e., x-axis field 50 in FIG. 2B) generated by the concentrator and an applied field in the y-axis (y-axis field 52 in FIG. 2B) for a magnetic field sensor 814 (including a concentrator layer with one or more apertures and at least two magnetoresistance elements in any of the described arrangements). Consideration of map 804 reveals that the y-axis field is transformed into a differential x-axis field.

Also shown in FIG. 8 is a map 808 illustrating the intensity of field in the x-axis (i.e., x-axis field 50 in FIG. 2B) generated by the concentrator and an applied field in the x-axis for a magnetic field sensor 814 (including a concentrator layer with one or more apertures and at least two magnetoresistance elements in any of the described arrangements). Consideration of map 808 reveals that the x-axis field is transformed into common mode x-axis field.

Figure 9:
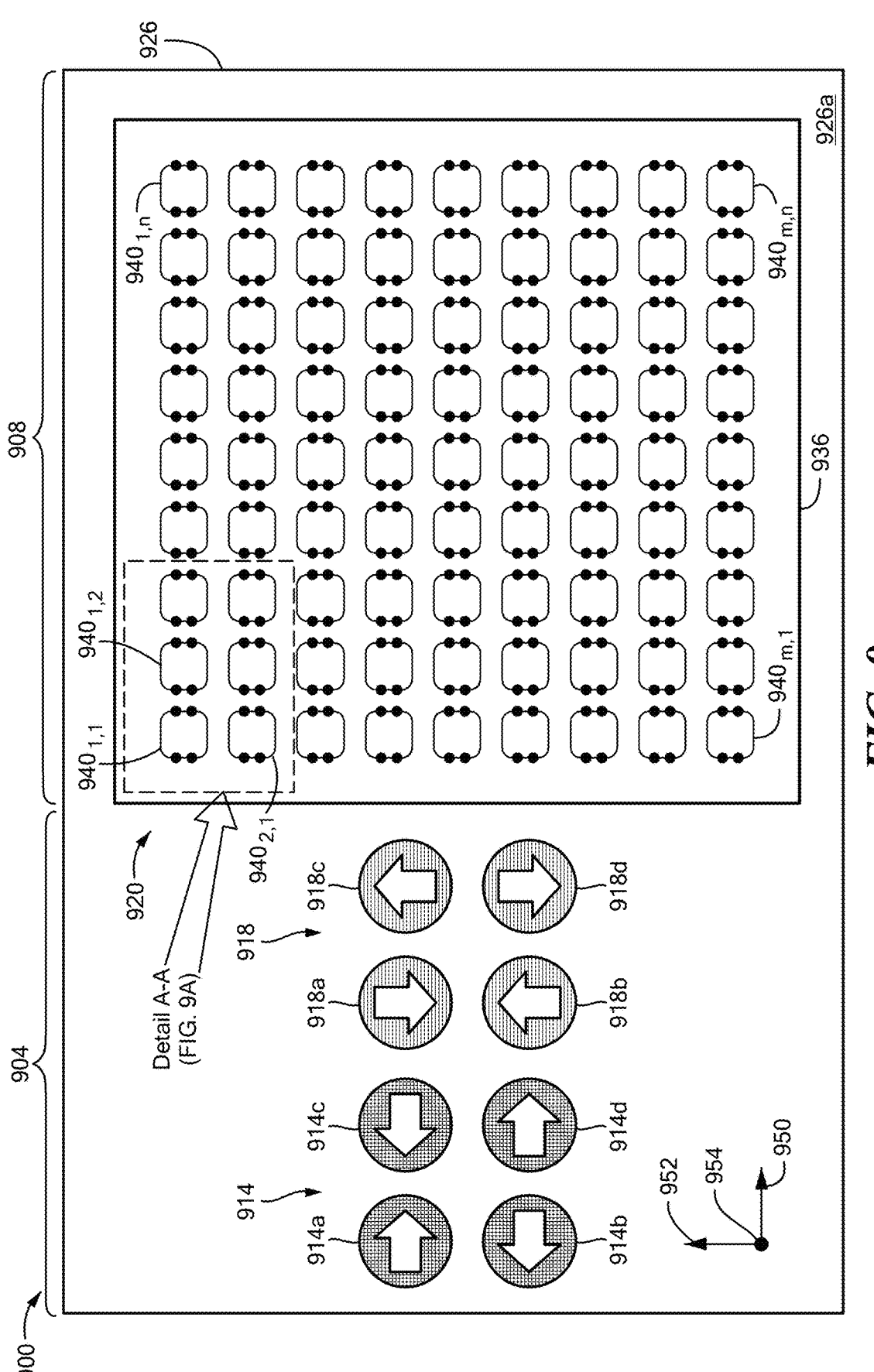
FIG. 9 is a top view of yet another alternative magnetoresistance element and concentrator arrangement including a grid configuration of concentrator apertures and example reference directions according to the disclosure.
Figure 9A:
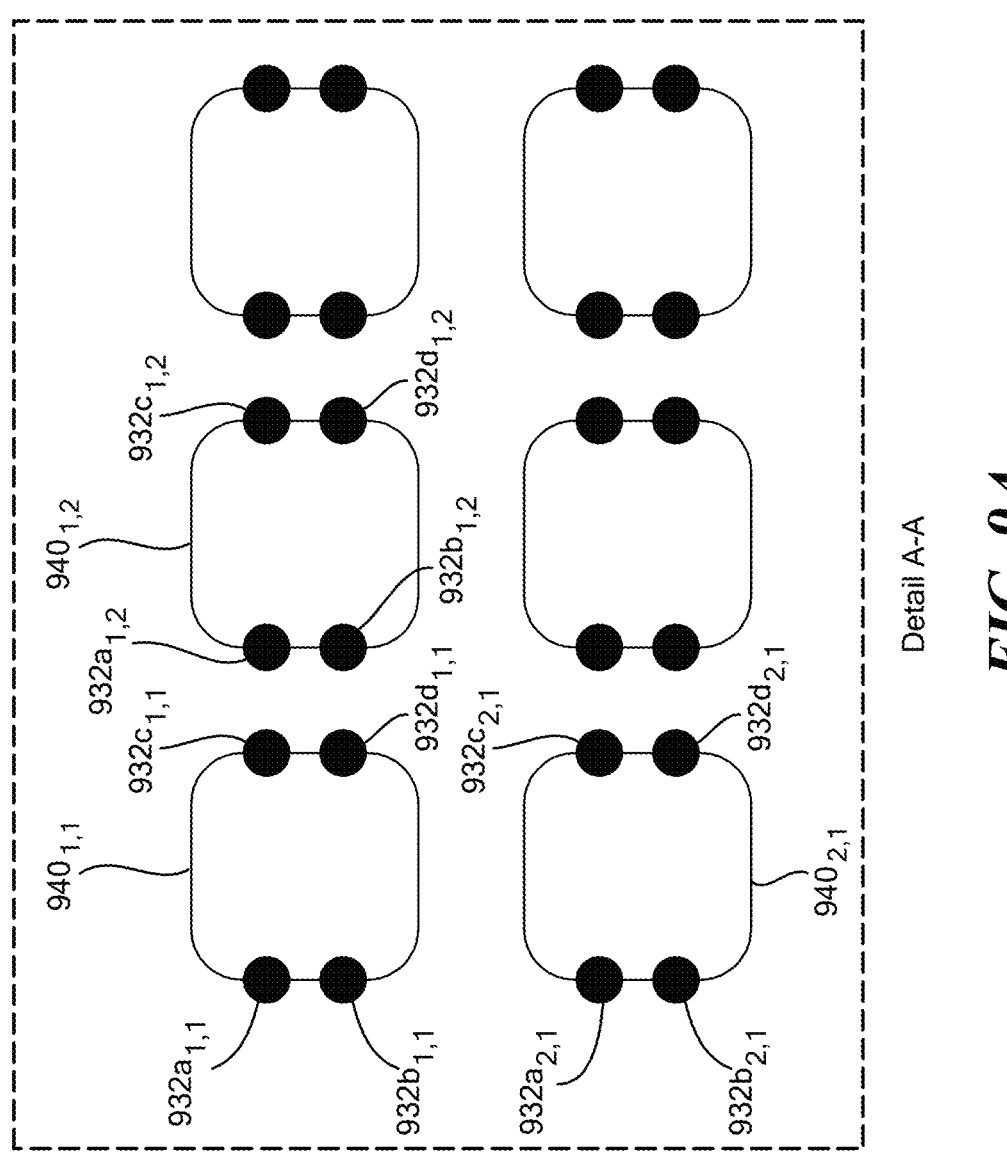
FIG. 9A shows detail of a portion of the grid configuration of FIG. 9.

Referring to FIGS. 9 and 9A, a multi-dimensional position sensor 900 can sense position in up to three dimensions. The plane of semiconductor die 926 defined by the surface 926_a_ is formed by an x-axis or x-direction 950 and a y-axis or y-direction 952. A z-axis or z-direction 954 is perpendicular to the die surface 926_a_ (and is thus illustrated by a "·" symbol, as its direction is into the page). The sensor 900 can sense an applied field in one or more of the x-direction 950, the y-direction 952, and/or the z-direction 954.

Sensor 900 includes a concentrator layer 936 disposed over a first portion 908 of the semiconductor die surface 926_a_. A second portion 904 of the semiconductor die surface 926_a_ does not have a concentrator layer.

The position sensor 900 can include a first set of magnetoresistance elements 914 configured to sense an in-plane applied magnetic field in the x-direction 950. Thus, elements 914 can have a reference direction indicated by the arrows within the elements that are coincident with the x-axis 950. Similarly, a second set of magnetoresistance elements 918 can be configured to sense an in-plane applied magnetic field in the y-direction 952. Thus, elements 918 can have a reference direction indicated by the arrows within the elements that are coincident with the y-direction 952.

Out-of-plane applied magnetic field is sensed by the configuration 920 including concentrator layer 936 having one or more apertures 940 and magnetoresistance elements (referred to generally as elements 932) arranged adjacent to edges of a respective aperture. By operation of concentrator layer 936, applied in-plane x-axis magnetic field and in-plane y-axis magnetic field is shunted away from the magnetoresistance elements. Applied out-of-plane z-axis magnetic field is redirected by concentrator layer 936 to present an in-plane differential magnetic field to the magnetoresistance elements.

Concentrator layer 936 can include a plurality of apertures $940_{1,1}$-$940_{m,n}$ arranged in a grid, or matrix, where m is the number of rows and n is the number of columns in the grid. Each aperture can be described as having a west edge on a left side of the aperture, an east edge on a right side of the aperture, a north edge on a top side of the aperture, and a south edge on a bottom side of the aperture.

In the example configuration 920, each aperture has a plurality of magnetoresistance elements adjacent to the west edge and a plurality of magnetoresistance elements adjacent to the east edge. For example, as shown in detail A-A in FIG. 9A, aperture $940_{1,1}$, has a first magnetoresistance element $932a_{1,1}$ and a second magnetoresistance element $932b_{1,1}$, both positioned adjacent to the west edge and further has a third magnetoresistance element $932c_{1,1}$ and a fourth magnetoresistance element $932d_{1,1}$, both positioned adjacent to the east edge. Other apertures can have the same arrangement of elements adjacent to the edges as in the illustrated example or can have a different number of elements. Thus, aperture $940_{1,2}$, has a first magnetoresistance element $932a_{1,2}$ and a second magnetoresistance element $932b_{1,2}$, both positioned adjacent to the west edge and further has a third magnetoresistance element $932c_{1,2}$ and a fourth magnetoresistance element $932d_{1,2}$, both positioned adjacent to the east edge. Similarly, aperture $940_{2,1}$ has a first element $932a_{2,1}$ and a second element $932b_{2,1}$ both adjacent to the west edge, a third element $932c_{2,1}$ and a fourth element $932d_{2,1}$ both adjacent to the east edge, and so forth for other apertures. It will be appreciated that other numbers of magnetoresistance elements can be adjacent to the aperture edges including more or less than the illustrated two elements.

It will be appreciated by those of ordinary skill in the art that in some applications, three-dimensional sensing is not required and one or two-dimensional sensing will suffice. Thus, a sensor can include either elements 914 or elements 918 (i.e., can provide either x-direction sensing or y-direction sensing) and also include elements in configuration 920 to accomplish out-of-plane z-axis sensing.

Advantageously, the magnetic field sensing elements of arrangements 914, 918, and 920 can be formed from a single TMR stack. In this way, manufacture of the sensor 900 can be simplified and less costly than otherwise possible.

Figure 9B:
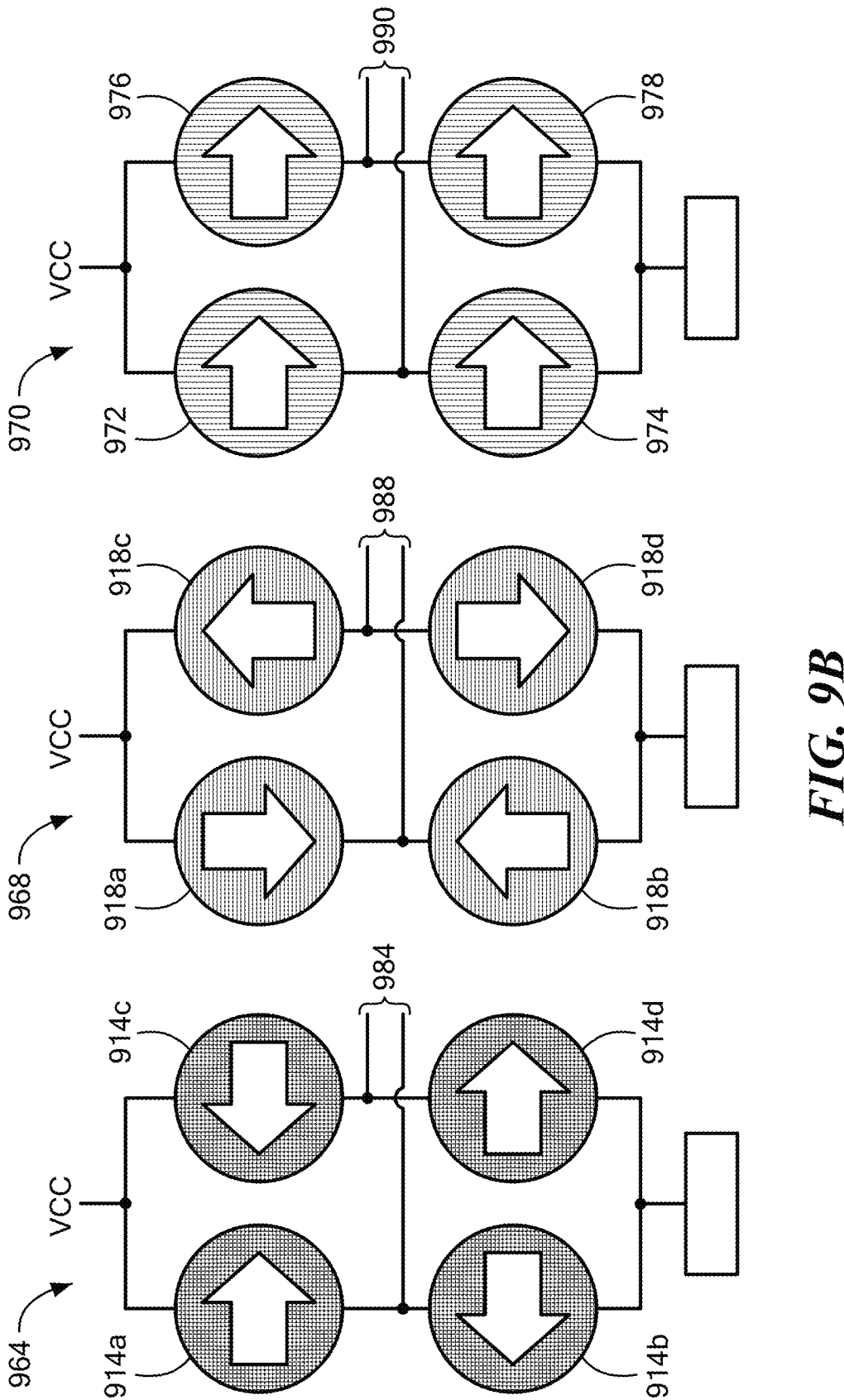
FIG. 9B illustrates example full bridge configurations showing different example reference directions of magnetoresistance elements according to the disclosure.

Referring also to FIG. 9B, bridges 964, 968, 970 are provided to sense applied magnetic fields in the x-direction 950, the y-direction 952, and the z-direction 954, respectively. To this end, bridge 964 represents an electrical coupling of elements 914 and bridge 968 represents an electrical coupling of elements 918. In particular, bridge 964 includes the four elements 914a-914d arranged as two series-coupled legs of two elements each, with the two legs of the bridge coupled in parallel between VCC and ground, as shown. Voltages at the intermediate nodes of each of the bridge legs can provide a differential output signal 984 indicative of x-axis applied field. Similarly, bridge 968 includes the four elements 918a-918d arranged as two series-coupled legs of two elements each, with the two legs of the bridge coupled in parallel between VCC and ground, as shown. Voltages at the intermediate nodes of the bridge legs can provide a differential output signal 988 indicative of the y-axis applied field.

Bridge 970 represents an electrical coupling of magnetoresistance elements associated with configuration 920 of FIGS. 9 and 9A. In particular, bridge 970 includes a first series-coupled leg of elements 972, 974 and a second series-coupled leg of elements 976, 978. Both such legs are coupled in parallel with each other between VCC and ground, as shown.

Each of the bridge elements 972, 974, 976, 978 can be formed by a coupling of a plurality of the elements shown in configuration 920 of FIGS. 9 and 9A. For example, bridge element 972 can represent a coupling of top west elements associated with each aperture $940_{1,1}$-$940_{m,n}$. In other words, elements $932a_{1,1}$-$932a_{m,n}$ can be coupled together to provide bridge element 972. Bridge element 978 can represent a coupling of bottom west elements associated with apertures $940_{1,1}$-$940_{m,n}$. In other words, elements $932b_{1,1}$-$932b_{m,n}$ can be coupled together to provide bridge element 978. Further, bridge element 976 can represent a coupling of top east elements associated with apertures $940_{1,1}$-$940_{m,n}$. In other words, elements $932c_{1,1}$-$932c_{m,n}$ can be coupled together to provide bridge element 976. And bridge element 974 can represent a coupling of bottom east elements associated with apertures $940_{1,1}$-$940_{m,n}$. In other words, elements $932d_{1,1}$-$932d_{m,n}$ can be coupled together to provide bridge element 978.

A differential output signal 990 of bridge 970 is taken between the elements 972, 974 and between elements 976, 978, as shown. The output signal 990 is indicative of the z-axis applied field.

It will be appreciated that other couplings of a plurality of individual magnetoresistance elements can be used to form bridge 970 for out-of-plane applied magnetic field sensing. In general, in order to form a gradiometer capable of sensing the out-of-plane applied magnetic field, elements adjacent to the same side of a concentrator aperture (e.g., elements 932a, 932b) are diagonally arranged in the bridge (e.g., these elements form diagonally arranged bridge elements 972, 978). In an example arrangement in which there are more than the illustrated two magnetoresistance elements adjacent to each side of the concentrator layer apertures, every other element along an edge can be coupled together to form a respective bridge element.

It will be appreciated by those of ordinary skill in that art that other examples of couplings of multiple magnetoresistance elements 932 to form elements 972, 974, 976, 978 are possible, including a coupling of more elements 932 or fewer elements or some subset of elements. In general, the greater the number of pillars that make up each element 972, 974, 976, 978 of the bridge 970, the lower the susceptibility of the bridge to magnetic noise.

While the concentrator layers described herein achieve most of the desired sensitivity to out-of-plane applied fields and insensitivity to in-plane applied fields, a technique and structure providing so called "vortex" elements can be used to facilitate the desired insensitivity to in-plane applied fields. To this end, the magnetoresistance elements in the various embodiments described herein can be vortex elements. By vortex elements, it means that the elements are designed to have a pillar diameter and free layer thickness selected so that, together, these parameters result in the topology of the free layer generating a vortex. Example pillar diameters can be between 100 nm and 3 μm and example free layer thicknesses can be between 40 and 150 nm.

Vortex elements have very low or no sensitivity to any in-plane field that is not coincident with the pinning, or reference direction and vortex elements achieve a high level of linearity to in-plane fields aligned with the pinning, or reference direction. In the context of the three-dimensional sensor 900, use of vortex elements for elements 914, 918 enhances performance by increasing the linear range of the sensor and, by making elements 914 insensitive to y-axis in-plane applied field and by making elements 918 insensitive to x-axis in-plane applied field, eliminates common mode fields from impacting the elements and possibly also causing saturation. Additional aspects of vortex elements are described in a U.S. patent application Ser. No. 17/806,336, entitled "Magnetic Field Current Sensor to Reduce Stray Magnetic Fields" filed on Jun. 10, 2022, which patent application is hereby incorporated herein by reference.

Figure 10:
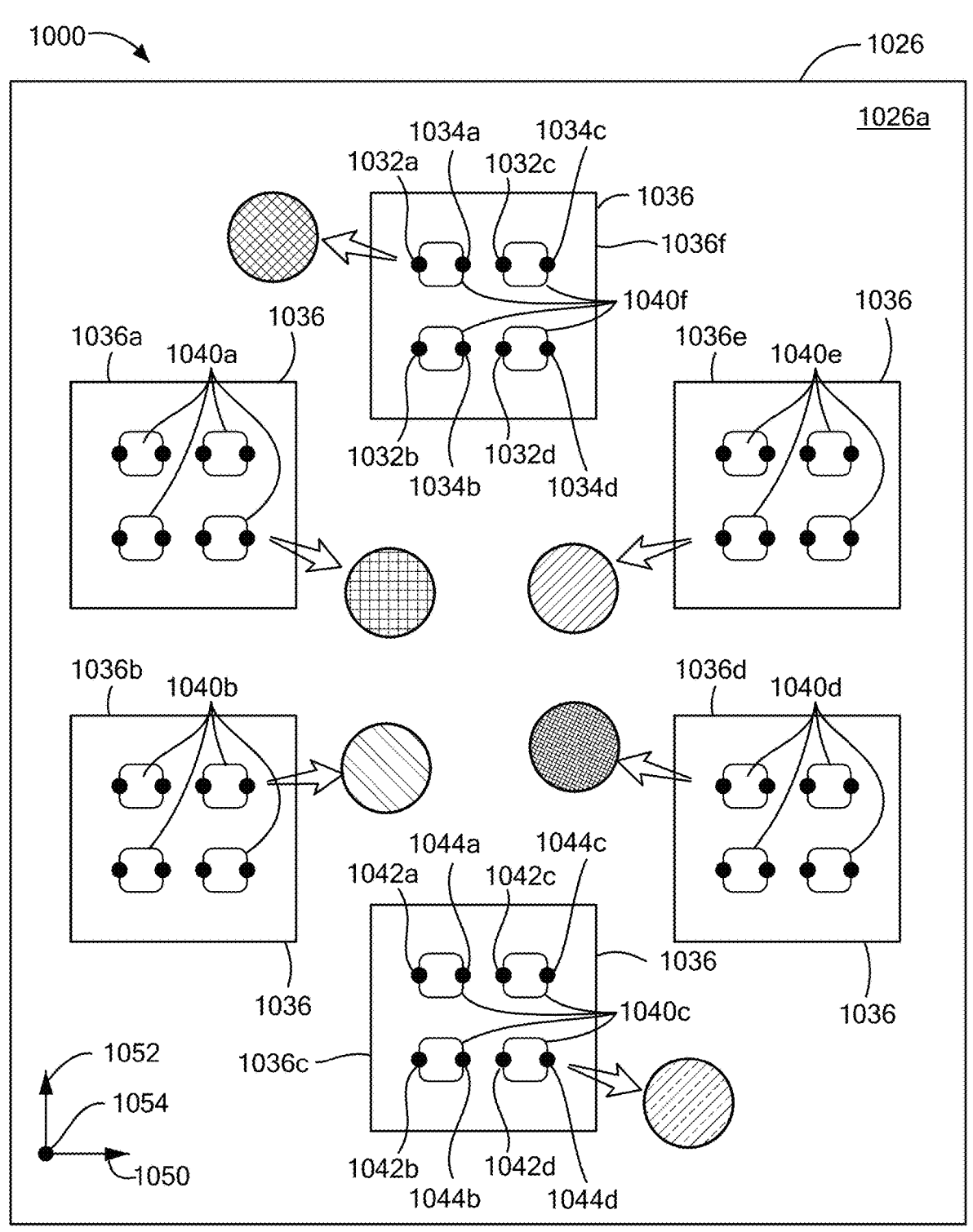
FIG. 10 illustrates an example arrangement of magnetoresistance element and concentrator grids for barycenter angle sensing according to the disclosure.

Referring to FIG. 10, a magnetic field sensor 1000 is configured to compute the position of a target, such as target 22 of FIG. 1, by computing a phase of the z-field mapping on a circle. Sensor 1000 implements stray field immune position sensing based on barycenter element placement and processing.

Sensor 1000 includes a semiconductor die 1026 having a surface 1026a. The plane of semiconductor die 1026 defined by the surface 1026a is formed by an x-axis or x-direction 1050 and a y-axis or y-direction 1052. A z-axis or z-direction 1054 is perpendicular to the die surface 1026a (and is thus illustrated by a "·" symbol, as its direction is into the page). In embodiments, the target 22 can be a "puck" magnetic having a north magnetic pole and a south magnetic pole and the sensor can determine the angular position of the target (e.g., the angular position of the north or south pole of the target) as it rotates in a plane above the die surface 1026a.

A concentrator layer 1036 disposed over the surface 1026a of the semiconductor die 1026 has a plurality of apertures arranged in at least four sets (and here six sets) of apertures. Each aperture set 1040a-1040f can include at least four apertures, with each aperture having a west or left edge, an east or right edge, a north or top edge, and a south or bottom edge.

In the example sensor 1000, concentrator layer 1036 includes a plurality of individual, spaced concentrator layers or layer portions 1036a-1036f, each disposed at a different location on the semiconductor die surface 1026a. The number of concentrator layers 1036a-1036f is illustrative only and this disclosure is not limited to any particular number of concentrator layers. Further, while concentrator layers 1036a-1036f are shown to be distinct layers spaced from each other over the semiconductor die surface 1026a, a contiguous concentrator layer can alternatively be provided, but with each set of apertures 1040a-1040f positioned at a different location over the die surface 1026a. Any pattern of sensing element placement may be used so long as the position of the magnetic field sensing elements is known and a barycenter of the measurements of the magnetic field produced by the target can be computed.

Sensor 1000 further includes a plurality of sets of magnetoresistance elements, each set associated with a different aperture set 1040a-1040f and including at least two magnetoresistance elements positioned adjacent to the west edge of one or more apertures and at least two magnetoresistance elements positioned adjacent to the east edge of one or more apertures. For example, as labeled in connection with aperture set 1040f, each aperture within the set has a magnetoresistance element 1032a, 1032b, 1032c, 1032d adjacent to the west edge of the respective aperture and a magnetoresistance element 1034a, 1034b, 1034c, 1034d adjacent to the east edge of the respective aperture, as shown. It will be appreciated by those of ordinary skill in the art that other numbers of magnetoresistance elements can be positioned adjacent to edges of the apertures.

Figure 10A:
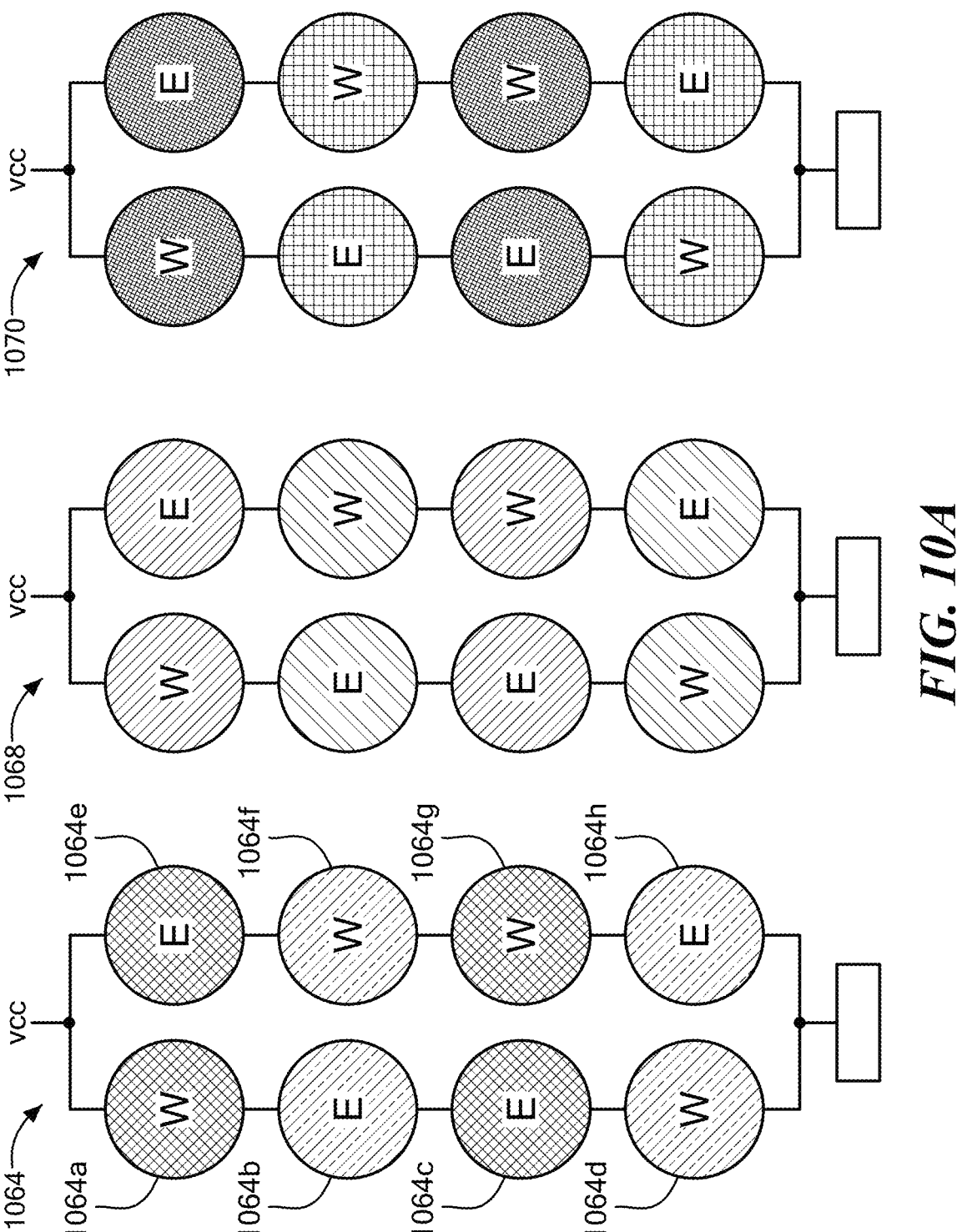
FIG. 10A illustrates example bridge configurations for coupling of the magnetoresistance elements of FIG. 10.

Referring also to FIG. 10A, bridges 1064, 1068, 1070 are provided to sense applied magnetic field in the z-direction 1054 with each bridge representing an electrical coupling of magnetoresistance elements associated with aperture sets 1040a-1040f according to the shading patterns shown in FIGS. 10 and 10A. To this end, bridge 1064 represents an electrical coupling of elements adjacent to apertures of aperture sets 1040c and 1040f, bridge 1068 represents an electrical coupling of elements adjacent to aperture sets 1040b and 1040e, and bridge 1070 represents an electrical coupling of elements adjacent to aperture sets 1040a, 1040d.

For example, within a given aperture set, as labeled for aperture set 1040f, magnetoresistance elements 1034a, 1034b positioned adjacent to the east edge of a respective aperture are coupled together to form a first magnetoresistance element 1064a, magnetoresistance elements 1032a, 1032b positioned adjacent to the west edge of a respective aperture are coupled together to form a second magnetoresistance 1064e, magnetoresistance elements 1032c, 1032d positioned adjacent to the west edge of a respective aperture are coupled together to form a magnetoresistance element 1064g, and magnetoresistance elements 1034c, 1034d positioned adjacent to the east edge of a respective aperture are coupled together to form magnetoresistance element 1064c. In a similar fashion for aperture set 1040c, magnetoresistance elements 1044a, 1044b positioned adjacent to the east edge of a respective aperture are coupled together to form a first magnetoresistance element 1064b, magnetoresistance elements 1042a, 1042b positioned adjacent to the west edge of a respective aperture are coupled together to form a second magnetoresistance 1064f, magnetoresistance elements 1042c, 1042d positioned adjacent to the west edge of a respective aperture are coupled together to form a magnetoresistance element 1064d, and magnetoresistance elements 1044c, 1044d positioned adjacent to the east edge of a respective aperture are coupled together to form magnetoresistance element 1064h. In this way, the magnetoresistance elements that are associated with different aperture sets 1040f, 1040c are coupled together to form bridge 1064 and the coupling provides west elements 1032a-1032d diagonally arranged with respect to each other and east elements 1034a-1034d diagonally arranged with respect to each other. This coupling provides a gradiometer in the sense that the differential signal taken from between bridge elements 1064b and 1064d and between bridge elements 1064f, 1064g is indicative of the differential out-of-plane applied magnetic field between 1036c and 1036f.

The other magnetoresistance elements associated with the other aperture sets 1040a, 1040b, 1040d, 1040e can be similarly coupled to form bridges 1068, 1070. Further, it will be appreciated by those of ordinary skill in the art that other numbers of elements and arrangements are possible for forming bridges 1064, 1068, 1070. It will also be appreciated by those of ordinary skill in the art that barycenter embodiments containing a different number of aperture sets than the illustrated six sets 1040a-1040f can form different numbers of bridges with different numbers of bridge elements.

A processor circuit (e.g., processing circuitry 46 of FIG. 1) is coupled to receive the output signal from of the bridges (as may follow pre-processing by an amplifier and digitization by an ADC) and determine a barycenter of the measurements of the magnetic field based on a position of the magnetic field sensing elements. The processor may also determine a position of a target 22 based on the computed barycenter and may include circuits designed to compute the barycenter based on the signals from the magnetic field sensing elements or a general processor that can execute software instructions for computing the barycenter. The processor may include a non-transient memory (such as a flash memory or ROM, for example), in which the software instructions can be stored and may also include circuitry to execute the software instructions.

The barycenter is a weighted average of the magnetic field measurements. For example, the position of each magnetic field sensing element (which can be represented by a vector in the Cartesian plane or in another coordinate system) may be weighted (e.g., multiplied) by the strength of the magnetic field as sensed by a particular magnetic field sensing element. These weighted vectors may then be summed or averaged to find the barycenter. In embodiments, the processor is configured to calculate a barycenter by summing the measurement vectors, to calculate an offset angle of the target with respect to a reference position by calculating an offset angle of the barycenter with respect to the reference position, and to calculate a distance of the magnetic target from the central point by calculating a distance of the barycenter from the central point and multiplying the distance of the barycenter from the central point by a predetermined scalar. Additional barycenter details are described in a U.S. Pat. No. 9,797,746, entitled "Systems And Methods For Detecting A Magnetic Target By Computing A Barycenter" issued on Oct. 24, 2017, which patent is hereby incorporated herein by reference.

The barycenter sensor 1000 can be combined with other magnetic field sensing element configurations to achieve two or three-dimensional angle sensing. By way of non-limiting examples, sensor 1000 can provide the xMR with concentrator block 24 of the sensor 14 of FIG. 1 and thus can be used in connection with optional additional elements to achieve three-dimensional angle sensing, including heterogeneous sensing with different sensing element types and/or processing methodologies as can facilitate meeting certain safety requirements.

As used herein, the term "sensor" is used to describe a circuit that uses one or more sensing elements, generally in combination with other circuits. For example, the sensor can be a magnetic field sensor with one or more magnetic field sensing elements. The magnetic field sensor can be, for example, a rotation detector, a movement detector, or a proximity detector. A linear sensor can sense a magnetic field strength. A rotation detector (or movement detector) can senses passing target objects, for example, magnetic domains of a ring magnet or a ferromagnetic target (e.g., gear teeth) where the magnetic field sensor is used in combination with a back-bias or other magnet and can determine target movement speed. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

The invention claimed is:

1. A magnetic field sensor to sense an applied magnetic field to be sensed by the magnetic field sensor, comprising:
   a semiconductor die having a surface that defines a plane of the semiconductor die;
   a first magnetoresistance element supported by the surface of the semiconductor die;
   a second magnetoresistance element supported by the surface of the semiconductor; and
   a concentrator layer disposed over the surface of the semiconductor die and having an aperture with a first edge and a second edge substantially parallel to the first edge, wherein the first magnetoresistance element is positioned adjacent to the first edge of the aperture and has a first reference direction parallel to the surface of the semiconductor die and substantially perpendicular to the first edge of the aperture and wherein the second magnetoresistance element is positioned adjacent to the second edge of the aperture and has the first reference direction.

2. The magnetic field sensor of claim 1 wherein the concentrator layer is disposed on the surface of the semiconductor die.

3. The magnetic field sensor of claim 1 further comprising an insulator disposed on the surface of the semiconductor die, wherein the concentrator layer is disposed on the insulator.

4. The magnetic field sensor of claim 1 wherein the first magnetoresistance element and the second magnetoresistance element are TMR elements.

5. The magnetic field sensor of claim 1 wherein the concentrator layer is configured to redirect the applied magnetic field to present a differential magnetic field parallel to the plane of the semiconductor die to the first magnetoresistance element and the second magnetoresistance element in response to the applied magnetic field perpendicular to the plane of the semiconductor die, and to present a reduced magnitude and common mode magnetic field to the first magnetoresistance element and the second magnetoresistance element in response to the applied magnetic field parallel to the plane of the semiconductor die.

6. The magnetic field sensor of claim 5 wherein an output signal of the magnetic field sensor generated by subtraction of signals from the first magnetoresistance element and the second magnetoresistance element is sensitive to the applied magnetic field perpendicular to the plane of the semiconductor die and insensitive to the applied magnetic field parallel to the plane of the semiconductor die.

7. The magnetic field sensor of claim 1 wherein the concentrator layer has a plurality of apertures arranged in a grid comprising a plurality of rows and a plurality of columns, wherein each of the plurality of apertures has a respective first edge and a respective second edge substantially parallel to the respective first edge, wherein the magnetic field sensor further comprises a plurality of additional first magnetoresistance elements and a plurality of additional second magnetoresistance elements, wherein each of the plurality of apertures further has a respective first magnetoresistance element positioned adjacent to the respective first edge and a respective second magnetoresistance element positioned adjacent to the respective second edge.

8. The magnetic field sensor of claim 7 wherein the grid forms a square, an ellipse, a circle, or a rectangle.

9. The magnetic field sensor of claim 7 wherein a spacing between adjacent rows of the grid is the same as a spacing between adjacent columns of the grid.

10. The magnetic field sensor of claim 7 wherein a spacing between adjacent rows of the grid is different than a spacing between adjacent columns of the grid.

11. The magnetic field sensor of claim 7 wherein a spacing between each of the plurality of rows of the grid is the same.

12. The magnetic field sensor of claim 7 wherein a spacing between at least two adjacent rows of the plurality of rows of the grid is different than a spacing between at least two other adjacent rows of the plurality of rows of the grid.

13. The magnetic field sensor of claim 7 wherein the concentrator layer has an outer edge and wherein a distance between a closest one of the plurality of apertures to the outer edge of the concentrator layer is larger than a spacing between adjacent apertures of the plurality of apertures.

* * * * *